US012009295B2

(12) United States Patent
Williams et al.

(10) Patent No.: US 12,009,295 B2
(45) Date of Patent: Jun. 11, 2024

(54) COMB / FISHBONE METAL STACK

(71) Applicant: QUALCOMM Incorporated, San Diego, CA (US)

(72) Inventors: Thomas Hua-Min Williams, Irvine, CA (US); Matthew Chauncey Kusbit, Santee, CA (US); Luis Chen, Chula Vista, CA (US); Keyurkumar Karsanbhai Kansagra, Bangalore (IN); Smeeta Heggond, Bagalkot (IN)

(73) Assignee: QUALCOMM INCORPORATED, San Diego, CA (US)

( * ) Notice: Subject to any disclaimer, the term of this patent is extended or adjusted under 35 U.S.C. 154(b) by 347 days.

(21) Appl. No.: 17/454,203

(22) Filed: Nov. 9, 2021

(65) Prior Publication Data

US 2023/0141245 A1     May 11, 2023

(51) Int. Cl.
*H01L 21/00* (2006.01)
*H01L 23/528* (2006.01)
*H01L 27/092* (2006.01)

(52) U.S. Cl.
CPC .......... *H01L 23/528* (2013.01); *H01L 27/092* (2013.01)

(58) Field of Classification Search
CPC .... H01L 23/528; H01L 27/092; G06F 30/392
See application file for complete search history.

(56) References Cited

U.S. PATENT DOCUMENTS

| 9,269,492 | B2 * | 2/2016 | Zhu | H01G 4/38 |
| 9,640,522 | B1 * | 5/2017 | Sahu | H01L 27/11807 |
| 11,244,895 | B2 * | 2/2022 | Manchana | H01L 27/0629 |
| 11,302,636 | B2 * | 4/2022 | Lee | G06F 30/392 |
| 11,710,733 | B2 * | 7/2023 | Lim | H01L 23/5286 |
| | | | | 257/401 |

(Continued)

FOREIGN PATENT DOCUMENTS

| TW | 202335310 A | * | 9/2023 | ......... H01L 27/0733 |
| WO | 2017184300 A2 | | 10/2017 | |

(Continued)

OTHER PUBLICATIONS

International Search Report and Written Opinion—PCT/US2022/046120—ISA/EPO—Jan. 18, 2023.

*Primary Examiner* — Laura M Menz
(74) *Attorney, Agent, or Firm* — Procopio, Cory, Hargreaves & Savitch LLP

(57) ABSTRACT

An IC includes a first set of MOS transistors configured to have a common first transistor source/drain terminal A, a first transistor gate, and a first transistor source/drain terminal B. In addition, the IC includes a first plurality of interconnect stacks coupled to the first transistor source/drain terminal A. Each interconnect stack of the first plurality of interconnect stacks extends in a second direction over at least a portion of the first set of MOS transistors and includes consecutive metal layer interconnects. Further, the IC includes a first comb interconnect structure extending in a first direction orthogonal to the second direction, with comb fingers extending in the second direction over at least a portion of the first set of MOS transistors and the first plurality of interconnect stacks. The first comb interconnect structure is coupled to the first plurality of interconnect stacks.

46 Claims, 7 Drawing Sheets

(56) References Cited

U.S. PATENT DOCUMENTS

| | | | | |
|---|---|---|---|---|
| 2014/0092523 | A1* | 4/2014 | Zhu | H01G 4/012 |
| | | | | 427/79 |
| 2014/0195997 | A1* | 7/2014 | Tseng | G06F 30/39 |
| | | | | 716/122 |
| 2016/0126180 | A1* | 5/2016 | Meng | H01L 23/5283 |
| | | | | 257/774 |
| 2018/0145071 | A1* | 5/2018 | Zhao | H03K 17/162 |
| 2021/0073454 | A1* | 3/2021 | Su | G03F 1/36 |
| 2021/0104463 | A1* | 4/2021 | Lee | H01L 23/5283 |
| 2021/0280571 | A1* | 9/2021 | Lim | H01L 27/0207 |
| 2021/0375747 | A1* | 12/2021 | Manchana | H01L 29/1087 |
| 2022/0115405 | A1* | 4/2022 | Lim | G06F 30/394 |
| 2022/0343054 | A1* | 10/2022 | Su | G06F 30/367 |
| 2023/0141245 | A1* | 5/2023 | Williams | H01L 27/0207 |
| | | | | 257/369 |
| 2023/0253400 | A1* | 8/2023 | Lee | H01L 27/0733 |
| | | | | 257/296 |

FOREIGN PATENT DOCUMENTS

| | | | | |
|---|---|---|---|---|
| WO | WO-2022119714 A1 * | 6/2022 | | H01L 21/823871 |
| WO | WO-2023086175 A1 * | 5/2023 | | H01L 23/528 |

* cited by examiner

COMB / FISHBONE METAL STACK

TECHNICAL FIELD

The present disclosure relates generally to a layout structure, and more particularly, to an integrated circuit (IC) with a comb/fishbone metal stack interconnect structure.

INTRODUCTION

A typical IC includes a stack of sequentially formed layers. Each layer may be stacked or overlaid on a prior layer and patterned to form the shapes that define transistors (e.g., field effect transistors (FETs), fin FETs (FinFETs), gate-all-around (GAA) FETs (GAAFETs), and/or other multigate FETs) and connect the transistors into circuits. Devices may be arranged based on a particular layout structure. There is currently a need for improved layout structures, including improved layout structures for providing transistor connections.

BRIEF SUMMARY

In an aspect of the disclosure, an IC includes a first set of metal oxide semiconductor (MOS) transistors. The first set of MOS transistors is configured to have a common first transistor source/drain terminal A, a first transistor gate, and a first transistor source/drain terminal B. In addition, the IC includes a first plurality of interconnect stacks coupled to the first transistor source/drain terminal A. Each interconnect stack of the first plurality of interconnect stacks extends in a second direction over at least a portion of the first set of MOS transistors and includes consecutive metal layer interconnects. Further, the IC includes a first comb interconnect structure extending in a first direction orthogonal to the second direction, with comb fingers extending in the second direction over at least a portion of the first set of MOS transistors and the first plurality of interconnect stacks. The first comb interconnect structure is coupled to the first plurality of interconnect stacks. The provided IC has a lower via resistance than is available through a grid-style layout, and when utilized for transistor connections, provides for a reduced IR drop and reduced parasitic resistances/capacitances than is available through a grid-style layout.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
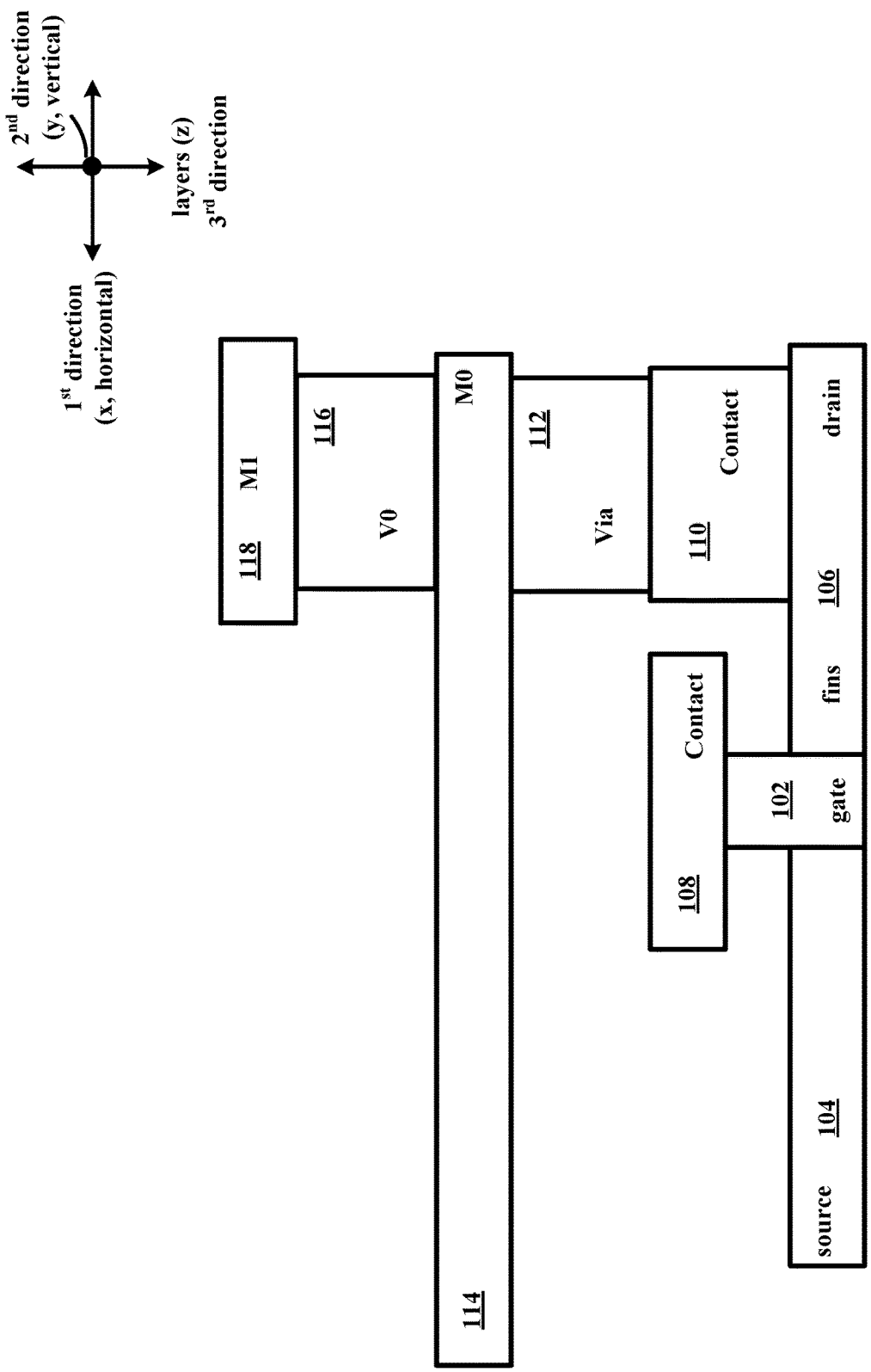
FIG. 1 is a first diagram illustrating a side view of various layers within an IC.

FIG. 1 is a first diagram 100 illustrating a side view of various layers within a cell device and IC. The various layers change in the z direction (labeled as the $3^{rd}$ direction). As illustrated in FIG. 1, a transistor has a gate 102 (which may be referred to as POLY in some instances even though the gate may be formed of metal, polysilicon, or a combination of polysilicon and metal), a source 104, and a drain 106. The source 104 and the drain 106 may be formed by fins. The gate 102 may extend in a second direction (e.g., vertical direction along the y axis coming out of the page), and the fins may extend in a first direction orthogonal to the second direction (e.g., horizontal direction along the x axis). A contact layer interconnect 108 (also referred to as a metal POLY (MP) layer interconnect, or contact B (CB) layer interconnect) may contact the gate 102. A contact layer interconnect 110 (also referred to as a metal diffusion (MD) layer interconnect, or contact A (CA) layer interconnect) may contact the source 104 and/or the drain 106. A via 112 (also referred to as via A (VA)) may contact the contact layer interconnect 110. A metal 0 ($M_0$) layer interconnect 114 may contact the via 112. The $M_0$ layer interconnect 114 is illustrated as extending in the first direction, but may also extend in the second direction. A via $V_0$ 116 may contact the $M_0$ layer interconnect 114. A metal 1 ($M_1$) layer interconnect 118 may contact the via $V_0$ 116. The $M_1$ layer interconnect 118 is illustrated as extending in the second direction, but may alternatively extend in the first direction. Higher layers include a via layer including vias $V_1$, a metal 2 ($M_2$) layer including $M_2$ layer interconnects, and higher via/metal layers. The $M_2$ layer and higher layer interconnects may extend in the first direction or the second direction. Metal layers at a metal q ($M_q$) layer and above may extend in both the first and second directions. A cell device may be implemented with FinFETs (as illustrated), GAAFETs, or other multigate FETs. For a continuous oxide diffusion (OD) region across multiple devices, the fins are continuous (in the first direction) across the multiple devices. For a discontinuous OD region across multiple devices, the fins are separate at a diffusion break (e.g., single/double diffusion break extending in the second direction) between different sets of the multiple devices.

Figure 2:
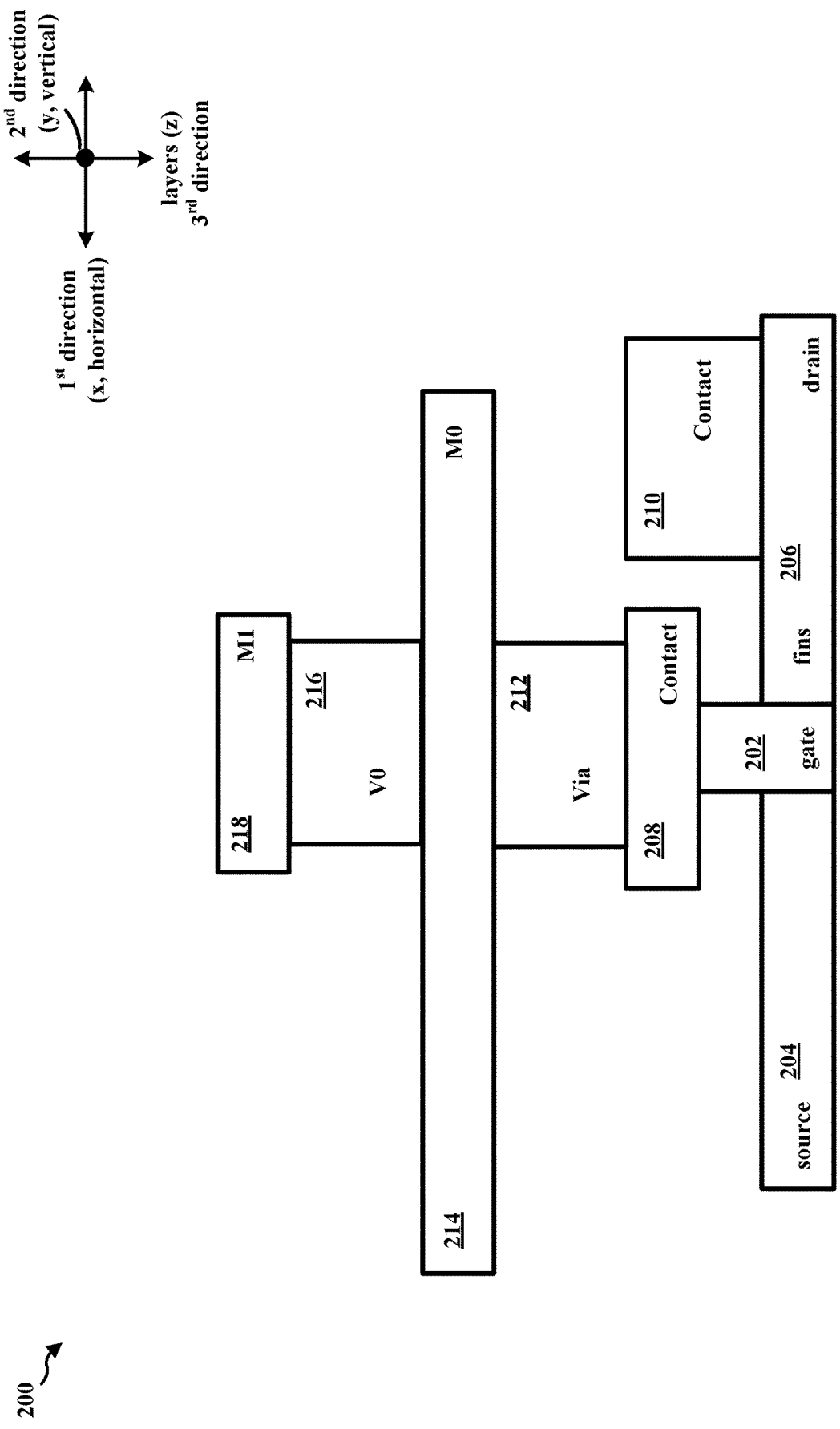
FIG. 2 is a second diagram illustrating a side view of various layers within an IC.

FIG. 2 is a second diagram 200 illustrating a side view of various layers within a standard cell and IC. The various layers change in the z direction (labeled as the $3^{rd}$ direction). As illustrated in FIG. 2, a transistor has a gate 202, a source 204, and a drain 206. The source 204 and the drain 206 may be formed by fins. The gate 202 may extend in a second direction (e.g., vertical direction along the y axis coming out of the page), and the fins may extend in a first direction orthogonal to the second direction (e.g., horizontal direction along the x axis). A contact layer interconnect 208 (also referred to as MP layer interconnect or CB layer interconnect) may contact the gate 202. A contact layer interconnect 210 (also referred to as MD layer interconnect or CA layer interconnect) may contact the source 204 and/or the drain 206. A via 212 (also referred to as via B (VB)) may contact the contact layer interconnect 208. An $M_0$ layer interconnect 214 may contact the via 212. The $M_0$ layer interconnect 214 is illustrated as extending in the first direction, but may also extend in the second direction. A via $V_0$ 216 may contact the $M_0$ layer interconnect 214. An $M_1$ layer interconnect 218 may contact the via $V_0$ 216. The $M_1$ layer interconnect 218 is illustrated as extending in the second direction, but may alternatively extend in the first direction. Higher layers include a via layer including vias $V_1$, an $M_2$ layer including $M_2$ layer interconnects, and higher via/metal layers. The $M_2$ layer and higher layer interconnects may extend in the first direction or the second direction. Metal layers at an $M_q$ layer and above may extend in both the first and second directions. A cell device may be implemented with FinFETs (as illustrated), GAAFETs, or other multigate FETs. For a continuous OD region across multiple devices, the fins are continuous (in the first direction) across the multiple devices. For a discontinuous OD region across multiple devices, the fins are separate at a diffusion break (e.g., single/double diffusion break extending in the second direction) between different sets of the multiple devices.

Since double patterning started at the 16 nm process node, process nodes have required that metal interconnects be in preferred metal directions (i.e., in either the first direction or the second direction) for facilitating easier design rule check (DRC) passes and increased compaction. Layouts based on such process node requirements often exhibited worse electromigration (EM) and/or voltage (IR) drop, and increased parasitic capacitance through metal structures that may resemble metal-oxide-metal (MOM) finger capacitors. In addition, parasitic via resistance has increasingly become a dominant contributor in smaller technology nodes. Lower level metals may not be fabricated with 90° turns, which may force layouts to use single vias in a grid style hookup. In a grid-style layout, each successive metal layer extends in an orthogonal direction compared to the adjacent metal layers so that the metal layers can be laid out in a grid. As the technologies nodes shrink, a grid-style layout may not allow for transistor layout connections to be made with a sufficient number of vias to avoid increasing parasitic via resistances.

As discussed below in relation to FIGS. 3-7, a non-grid style layout structure is provided for transistor connections. The layout structure reduces IR drop and parasitic resistances/capacitances as compared to grid-style layout structures.

Figure 3:
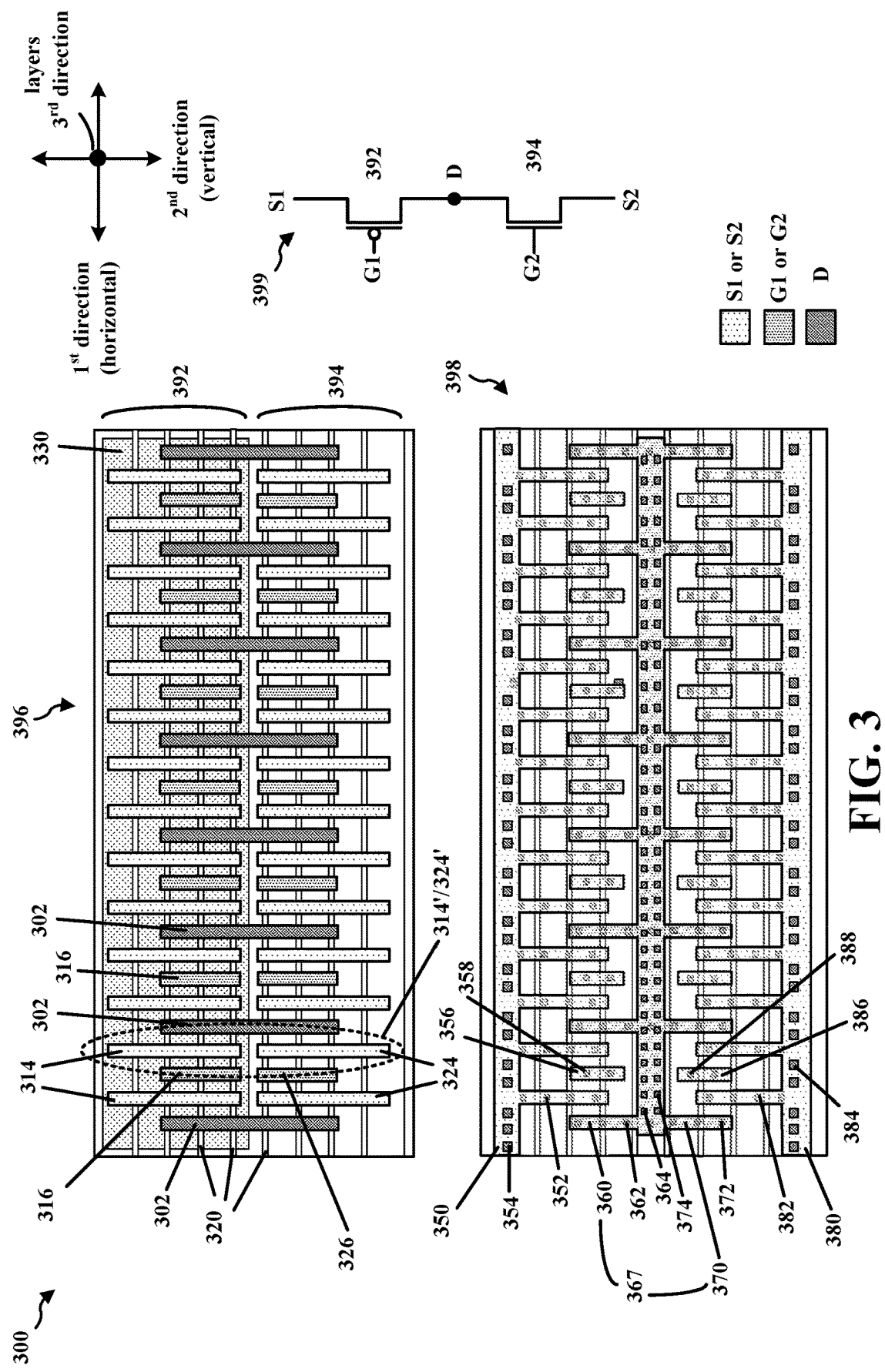
FIG. 3 are diagrams conceptually illustrating a top view of a plurality of interconnect stacks and a top view of comb/fishbone interconnect structures based on a first configuration.

FIG. 3 are diagrams 300 conceptually illustrating a top view 396 of a plurality of interconnect stacks and a top view 398 of comb/fishbone interconnect structures based on a first configuration. Referring to the diagram 396, an IC includes a set of p-type MOS (pMOS) transistors 392 connected in parallel, and a set of n-type MOS (nMOS) transistors 394 connected in parallel. As the set of pMOS transistors 392 are connected in parallel, they operate as one pMOS transistor 392, and as the set of nMOS transistors 394 are connected in parallel, they operate as one nMOS transistor 394 (see circuit diagram 399). In circuit diagram 399, a single pMOS transistor symbol 392 is shown to represent the set of pMOS transistors 392 connected in parallel because the set of pMOS transistors 392 are configured to operate as one pMOS transistor 392. Likewise, a single nMOS transistor symbol 394 is shown to represent the set of nMOS transistors 394 connected in parallel because the set of nMOS transistors 394 are configured to operate as one nMOS transistor 394. The pMOS/nMOS transistors fins 320 extend in the first direction. The pMOS transistors 392 may be within an n-type well (n-well) 330. MD interconnects (see FIGS. 1, 6) that extend in the second direction may contact the drains and sources of the pMOS transistors 392. The MD interconnects coupled to the drains of the pMOS transistors 392 may be coupled together by a first plurality of $M_0$ interconnects (see FIGS. 1, 6) extending in the first direction, and MD interconnects coupled to the sources of the pMOS transistors 392 may be coupled together by a second plurality of $M_0$ interconnects (see FIGS. 1, 6) extending in the first direction. The drains of the pMOS transistors 392 (i.e., node D) are therefore coupled to the first plurality of $M_0$ interconnects, which is coupled to the set of interconnect stacks 302. The sources of the pMOS transistors 392 (i.e., node S1) are therefore coupled to the second plurality of $M_0$ interconnects, which is coupled to the set of interconnect stacks 314. The gates of the pMOS transistors 392 (i.e., node G1) are coupled to the set of interconnect stacks 316. MD interconnects (see FIGS. 1, 6) that extend in the second direction may contact the drains and sources of the nMOS transistors 394. The MD interconnects coupled to the drains of the nMOS transistors 394 may be coupled together by a third plurality of $M_0$ interconnects (see FIGS. 1, 6) extending in the first direction, and MD interconnects coupled to the sources of the nMOS transistors 394 may be coupled together by a fourth plurality of $M_0$ interconnects (see FIGS. 1, 6) extending in the first direction. The drains of the nMOS transistors 394 (i.e., node D) are therefore coupled to the third plurality of $M_0$ interconnects, which is coupled to the set of interconnect stacks 302. The sources of the nMOS transistors 394 (i.e., node S2) are therefore coupled to the fourth plurality of $M_0$ interconnects, which is coupled to the set of interconnect stacks 324. The gates of the nMOS transistors 394 (i.e., node G2) are coupled to the set of interconnect stacks 326. The MD interconnects may be referred to as middle-end-of-line (MEOL) interconnects. The MEOL interconnects are on (metal) layers lower than back-end-of-line (BEOL) interconnects. The $M_0$ interconnects may be referred to as BEOL interconnects, and more specifically, the lowest metal layer BEOL interconnects.

Each of the sets of interconnect stacks 302, 314, 316, 324, 326 may be unidirectional in the second direction (i.e., extend only in the second direction) and may include a plurality of BEOL metal layer interconnects on consecutive BEOL metal layers, coupled together with a plurality of vias into a stack. The number of consecutive BEOL metal layers can vary in different implementations, such as 3, 4, 5, 6, etc. For example, the BEOL metal layer interconnects may be on an $M_1$ layer, an $M_2$ layer, a metal 3 ($M_3$) layer, and a metal 4 ($M_4$) layer. Each of the interconnect stacks 302, 314, 316, 324, 326 provides a lower via resistance connecting each interconnect to interconnects on an adjacent layer than can be provided by a grid-style layout, thereby providing for a reduced via resistance between the $M_4$ and $M_1$ layers compared to a grid-style layout. The interconnect stacks 302, 314, 316, 324, 326 provide a lower via resistance than can be provided by a grid-style layout because more vias are parallelized on the same rectangle of metal layer interconnects than can be provided at the grid junctions (i.e., locations where interconnects on adjacent layers intersect) of a grid-style layout. In addition, spacing of the interconnect stacks 302, 314, 316, 324, 326 may be increased so as to reduce the parasitic capacitance introduced by the adjacent stacks. The parasitic gate to drain capacitance $C_{gd}$ is further reduced through inserting a source-coupled interconnect stack 314'/324' (i.e., coupled to nodes S1/S2) between the gate-coupled interconnect stacks 316/326 (i.e., coupled to nodes G1/G2) and the drain-coupled interconnect stack 302 (i.e., coupled to node D). That is, rather than a source 314/324, gate 316/326, drain 302 interconnect stack order in the first direction (left to right), the provided layout has a source 314/324, gate 316/326, source 314'/324', drain 302 interconnect stack order in the first direction (left to right).

The sets of interconnects stacks 302, 314, 316, 324, 326 may generally be on the BEOL metal layers, between layers i and q−1, where the sets of interconnects stacks 302, 314, 316, 324, 326 are unidirectional in layers i to q−1, and where layer q is the first metal layer allowing for interconnects to extend in both the first and second directions. In one example, layer i is layer 1 (i.e., i=1). In other examples, i can be 0, 2, 3, 4, etc. Layer q may vary depending on the fabrication process technology. In one example, layer q is layer 5 (i.e., q=5). In other examples, q can be 4, 6, 7, etc.

Referring to the diagram 398, an IC further includes the comb interconnect structure 350 coupled to the set of interconnect stacks 314 (i.e., node S1) through vias 352, the comb interconnect structure 380 coupled to the set of interconnect stacks 324 (i.e., node S2) through vias 382, the fishbone interconnect structure 367 coupled to the set of interconnect stacks 302 (i.e., node D) through vias 362, 372, the set of interconnects 356 coupled to the set of interconnect stacks 316 (i.e., node G1) through the vias 358, and the set of interconnects 386 coupled to the set of interconnect stacks 326 (i.e., node G2) through the vias 388. The fishbone interconnect structure 367 is one structure, with comb interconnect substructures 360, 370. The illustrated vias 354, 384, 364, 374 provide connections to the adjacent higher metal layer interconnects (see FIG. 5). In one example, the comb interconnect structures 350, 380, the fishbone interconnect structure 367, the set of interconnects 356, and the set of interconnects 386 are on a metal 5 ($M_5$) layer. The spacing of the combs of the comb interconnect structures 350, 380, the fishbone interconnect structure 367, the set of interconnects 356, and the set of interconnects 386 are aligned with the lower layer interconnect stacks 302, 314, 316, 324, 326, and therefore also reduce the parasitic capacitance introduced by the interconnects. The parasitic gate to drain capacitance $C_{gd}$ is further reduced through the additional source-coupled combs of the comb interconnect structures 350, 380, which are aligned with the sets of interconnect stacks 314'/324', and that are between the gate-coupled sets of interconnects 356, 386 and a subset (i.e., one half) of the drain-coupled combs of the fishbone interconnect structure 367.

Referring again to the diagrams 396, 398, an IC may include a first set of MOS transistors 392 or 394. That is, the first set of MOS transistors may be pMOS transistors 392 or nMOS transistors 394. The first set of MOS transistors 392 or 394 may be configured to have a common first transistor source/drain terminal A, a first transistor gate, and a first transistor source/drain terminal B. The IC may further include a first plurality of interconnect stacks 302 coupled to the first transistor source/drain terminal A. Each interconnect stack of the first plurality of interconnect stacks 302 extends in a second direction over at least a portion of the first set of MOS transistors 392 or 394 and includes consecutive metal layer interconnects. The IC may further include a first comb interconnect structure 360 or 370 extending in a first direction orthogonal to the second direction, with comb fingers extending in the second direction over at least a portion of the first set of MOS transistors 392 or 394 and the first plurality of interconnect stacks 302. The first comb interconnect structure 360 or 370 is coupled to the first plurality of interconnect stacks 302. As described previously, the first transistor source/drain terminal A is a drain terminal (i.e., node D), but alternatively, the source/drain connections can be swapped (i.e., with the set of interconnect stacks 302 coupled to a source and the set of interconnect stacks 314 or 324 coupled to a drain), and in such a configuration the first transistor source/drain terminal A would be a source terminal (i.e., node S1 or S2). Note that the illustrated circuit configuration 399 would not apply to the alternate configuration, as the source connections would be coupled together and the drain connections would be uncoupled.

In one configuration, the IC further includes a second plurality of interconnect stacks 314 or 324 extending in the second direction over at least a portion of the first set of MOS transistors. The second plurality of interconnect stacks 314 or 324 is coupled to the first transistor source/drain terminal B. Each interconnect stack of the second plurality of interconnect stacks 314 or 324 includes consecutive metal layer interconnects. As described previously, the first transistor source/drain terminal B is a source terminal (i.e., node S1 or S2), but alternatively, the source/drain connections can be swapped (i.e., with the set of interconnect stacks 302 coupled to a source and the set of interconnect stacks 314 or 324 coupled to a drain), and in such a configuration the first transistor source/drain terminal B would be a drain terminal (i.e., node D). Note that the illustrated circuit configuration 399 would not apply to the alternate configuration, as the source connections would be coupled together and the drain connections would be uncoupled.

As discussed above, the sets of interconnect stacks may be on M1, M2, M3, and M4 layers, and the sets of comb interconnect structures 350, 380, the fishbone interconnect structure 367, the set of interconnects 356, and the set of interconnect 386 may be on an M5 layer. More generally, the sets of interconnect stacks may be on metal i (Mi), metal i+1 (Mi+1), . . . , metal q−1 (Mq−1) layers, and the sets of comb interconnect structures 350, 380, the fishbone interconnect structure 367, the set of interconnects 356, and the set of interconnect 386 may be on an Mq layer. Referring to the first plurality of interconnect stacks 302, each interconnect stack of the first plurality of interconnect stacks 302 may include metal p (Mp) layer interconnects for p=i, i+1, . . . , q−1 and corresponding vias Vp for p=i, i+1, . . . , q−2 coupling together each interconnect stack of the first plurality of interconnect stacks 302. Referring to the second plurality of interconnect stacks 314 or 324, each interconnect stack of the second plurality of interconnect stacks 314 or 324 may include Mp layer interconnects for p=i, i+1, . . . , q−1 and corresponding vias Vp for p=i, i+1, . . . , q−2 coupling together each interconnect stack of the second plurality of interconnect stacks 314 or 324. Further, the first comb interconnect structure 360 or 370 may be on the Mq layer. In one example, i=1 and q=5.

In one configuration, a pair of interconnect stacks of the second plurality of interconnect stacks 314 or 324 is between each adjacent pair of interconnect stacks of the first plurality of interconnect stacks 302.

In one configuration, the IC further includes a second comb interconnect structure 350 or 380 extending in the first direction, with comb fingers extending in the second direction over at least a portion of the second plurality of interconnect stacks 314 or 324. The second comb interconnect structure 350 or 380 is coupled to the second plurality of interconnect stacks 314 or 324. The first comb interconnect structure 360 or 370 and the second comb interconnect structure 350 or 380 are on the same metal layer, such as for example, an $M_q$ layer. In one configuration, the second comb interconnect structure 350 or 380 has a density of comb fingers double a density of the comb fingers of the first comb interconnect structure 360 or 370. The second comb interconnect structure 350 or 380 has double the fingers as the first comb interconnect structure 360 or 370 due to the additional comb fingers inserted between the gate/drain connections (i.e., the additional comb fingers are aligned with the sets of interconnect stacks 314' or 324'), which provide a source-coupled interconnect shielding between the gate-coupled interconnects 356 or 386 and the fingers of the drain-coupled first comb interconnect structure 360 or 370, thereby decreasing a parasitic $C_{gd}$ capacitance.

In one configuration, the IC may further include a third plurality of interconnect stacks 316 or 326 extending in the second direction over at least a portion of the first set of MOS transistors 392 or 394. The third plurality of interconnect stacks 316 or 326 is coupled to the first transistor gate (i.e., node G1 or G2). Each interconnect stack of the third plurality of interconnect stacks 316 or 326 includes consecutive metal layer interconnects. In one configuration, each interconnect stack of the third plurality of interconnect stacks 316 or 326 may include Mp layer interconnects for p=i, i+1, . . . , q−1 and corresponding vias Vp for p=i, i+1, . . . , q−2 coupling together each interconnect stack of the third plurality of interconnect stacks. In addition, the first comb interconnect structure 360 or 370 may be on an Mq layer. In one configuration, each interconnect stack of the third plurality of interconnect stacks 316 or 326 is between a corresponding adjacent pair of interconnect stacks of the second plurality of interconnect stacks 314 or 324.

In one configuration, the IC may further include a first plurality of interconnects 356 or 386 extending in the second direction over at least a portion of the third plurality of interconnect stacks 316 or 326. The first plurality of interconnects 356 or 386 is coupled to the third plurality of interconnect stacks 316 or 326. The first plurality of interconnects 356 or 386 is on the same metal layer as the first comb interconnect structure 360 or 370 and the second comb interconnect structure 350 or 380 (e.g., on an $M_q$ layer). In one configuration, each interconnect of the first plurality of interconnects 356 or 386 is between an adjacent pair of comb fingers of the second comb interconnect structure 350 or 380.

The first set of MOS transistors may be pMOS transistors 392 or nMOS transistors 394. Herein, so that the description below is not confusing, the first set of MOS transistors are assumed to be the pMOS transistors 392. Accordingly, an IC may include a first set of MOS transistors 392. The first set of MOS transistors 392 may be configured to have a common first transistor source/drain terminal A, a first transistor gate, and a first transistor source/drain terminal B. The IC may further include a first plurality of interconnect stacks 302 coupled to the first transistor source/drain terminal A. Each interconnect stack of the first plurality of interconnect stacks 302 extends in a second direction over at least a portion of the first set of MOS transistors 392 and includes consecutive metal layer interconnects. The IC may further include a first comb interconnect structure 360 extending in a first direction orthogonal to the second direction, with comb fingers extending in the second direction over at least a portion of the first set of MOS transistors 392 and the first plurality of interconnect stacks 302. The first comb interconnect structure 360 is coupled to the first plurality of interconnect stacks 302. As described above, the first transistor source/drain terminal A is a drain terminal (i.e., node D), but alternatively, the source/drain connections can be swapped (i.e., with the set of interconnect stacks 302 coupled to a source and the set of interconnect stacks 314 coupled to a drain), and in such a configuration the first transistor source/drain terminal A would be a source terminal (i.e., node S1). Note that the illustrated circuit configuration 399 would not apply to the alternate configuration, as the source connections would be coupled together and the drain connections would be uncoupled.

In one configuration, the IC may further include a second set of MOS transistors 394. The second set of MOS transistors 394 may be configured to have a common second transistor source/drain terminal B, a second transistor gate, and a second transistor source/drain terminal A. The IC may further include a second comb interconnect structure 370 extending in the first direction, with comb fingers extending in the second direction over at least a portion of the second set of MOS transistors 394 and the first plurality of interconnect stacks 302. The second comb interconnect structure 370 is coupled to the first plurality of interconnect stacks 302. The first comb interconnect structure 360 and the second comb interconnect structure 370 are configured into a fishbone interconnect structure 367. The first plurality of interconnect stacks 302 may be coupled to the second transistor source/drain terminal A, and each interconnect stack of the first plurality of interconnect stacks 302 may extend in the second direction over at least a portion of the second set of MOS transistors 394.

In one configuration, the IC may further include a second plurality of interconnect stacks 314 extending in the second direction over at least a portion of the first set of MOS transistors 392. The second plurality of interconnect stacks 314 is coupled to the first transistor source/drain terminal B. Each interconnect stack of the second plurality of interconnect stacks 314 includes consecutive metal layer interconnects. The IC may further include a third plurality of interconnect stacks 324 extending in the second direction over at least a portion of the second set of MOS transistors 394. The third plurality of interconnect stacks 324 is coupled to the second transistor source/drain terminal B. Each interconnect stack of the third plurality of interconnect stacks 324 includes consecutive metal layer interconnects. In one configuration, each interconnect stack of the first plurality of interconnect stacks 302 includes Mp layer interconnects for p=i, i+1, . . . q−1 and corresponding vias Vp for p=i, i+1, . . . , q−2 coupling together each interconnect stack of the first plurality of interconnect stacks 302. In one configuration, each interconnect stack of the second plurality of interconnect stacks 314 includes Mp layer interconnects for p=i, i+1, . . . q−1 and corresponding vias Vp for p=i, i+1, . . . , q−2 coupling together each interconnect stack of the second plurality of interconnect stacks 314. In addition, each interconnect stack of the third plurality of interconnect stacks 324 includes Mp layer interconnects for p=i, i+1, . . . , q−1 and corresponding vias Vp for p=i, i+1, . . . , q−2 coupling together each interconnect stack of the third plurality of interconnect stacks 324. Further, the fishbone interconnect structure may be on an Mq layer. In one configuration, a pair of interconnect stacks of the second plurality of interconnect stacks 314 is between each adjacent pair of interconnect stacks of the first plurality of interconnect stacks 302, and a pair of interconnect stacks of the third plurality of interconnect stacks 324 is between each adjacent pair of interconnect stacks of the first plurality of interconnect stacks 302. As illustrated in FIG. 3, the second plurality of interconnect stacks 314 and the third plurality of interconnect stacks 324 are collinear in the second direction.

In one configuration, the IC may further include a third comb interconnect structure 350 extending in the first direction orthogonal to the second direction, with comb fingers extending in the second direction over at least a portion of the second plurality of interconnect stacks 314. The third comb interconnect structure 350 is coupled to the second plurality of interconnect stacks 314. The third comb interconnect structure 350 and the fishbone interconnect structure 367 are on the same metal layer (e.g., an $M_q$ layer). In addition, the IC may further include a fourth comb interconnect structure 380 extending in the first direction orthogonal to the second direction, with comb fingers extending in the second direction over at least a portion of the third plurality of interconnect stacks 324. The fourth comb interconnect structure 380 is coupled to the third plurality of interconnect stacks 324. The fourth comb interconnect structure 380 is on the same metal layer as the fishbone interconnect structure 367 (e.g., an $M_q$ layer). In one configuration, the comb fingers of the third comb interconnect structure 350 are collinear in the second direction with the comb fingers of the fourth comb interconnect structure 380. In one configuration, the third comb interconnect structure 350 is configured to be coupled to a first voltage source, and the fourth comb interconnect structure 380 is configured to be coupled to a second voltage source different than the first voltage source. For example, the first voltage source may supply a power supply voltage $V_{dd}$ and the second voltage source may supply a ground voltage $V_{ss}$, where $V_{dd} > V_{ss}$. In one configuration, the third comb interconnect structure 350 has a density of comb fingers double a density of the comb fingers of the first comb interconnect structure 360, and the fourth comb interconnect structure 380 has a density of comb fingers double a density of the comb fingers of the second comb interconnect structure 370. As discussed above, the third and fourth comb interconnect structures 350, 380 have double the fingers as the first and second comb interconnect structure 360, 370 (i.e., the fishbone interconnect structure 367) due to the additional comb fingers inserted between the gate/drain connections (i.e., the additional comb fingers are aligned with the sets of interconnect stacks 314', 324'), which provide a source-coupled interconnect shielding between the gate-coupled interconnects 356, 386 and the fingers of the drain-coupled first and second comb interconnect structures 360, 370 (i.e., the fishbone interconnect structure 367), thereby decreasing a parasitic $C_{gd}$ capacitance.

In one configuration, the IC further includes a fourth plurality of interconnect stacks 316 extending in the second direction over at least a portion of the first set of MOS transistors 392. The fourth plurality of interconnect stacks 316 is coupled to the first transistor gate. Each interconnect stack of the fourth plurality of interconnect stacks 316 includes consecutive metal layer interconnects. In addition, in such a configuration, the IC further includes a fifth plurality of interconnect stacks 326 extending in the second direction over at least a portion of the second set of MOS transistors 394. The fifth plurality of interconnect stacks 326 is coupled to the second transistor gate. Each interconnect stack of the fifth plurality of interconnect stacks 326 includes consecutive metal layer interconnects. In one configuration, each interconnect stack of the fourth plurality of interconnect stacks 316 includes Mp layer interconnects for p=i, i+1, . . . , q−1 and corresponding vias Vp for p=i, i+1, . . . , q−2 coupling together each interconnect stack of the fourth plurality of interconnect stacks 316. In addition, in such a configuration, each interconnect stack of the fifth plurality of interconnect stacks 326 includes Mp layer interconnects for p=i, i+1, q−1 and corresponding vias Vp for p=i, i+1, . . . , q−2 coupling together each interconnect stack of the fifth plurality of interconnect stacks 326. Further, in such a configuration, the fishbone interconnect structure 367 is on an Mq layer. In one configuration, each interconnect stack of the fourth plurality of interconnect stacks 316 is between a corresponding adjacent pair of interconnect stacks of the second plurality of interconnect stacks 314. In addition, each interconnect stack of the fifth plurality of interconnect stacks 326 is between a corresponding adjacent pair of interconnect stacks of the third plurality of interconnect stacks 324. In one configuration, the fourth plurality of interconnect stacks 316 and the fifth plurality of interconnect stacks 326 are collinear in the second direction.

In one configuration, the IC further includes a first plurality of interconnects 356 extending in the second direction over at least a portion of the fourth plurality of interconnect stacks 316. The first plurality of interconnects 356 is coupled to the fourth plurality of interconnect stacks 316. The first plurality of interconnects 356 is on the same metal layer as the fishbone interconnect structure 367 (e.g., an $M_q$ layer). In addition, the IC further includes a second plurality of interconnects 386 extending in the second direction over at least a portion of the fifth plurality of interconnect stacks 326. The second plurality of interconnects 386 is coupled to the fifth plurality of interconnect stacks 326. The second plurality of interconnects 386 is on the same metal layer as the fishbone interconnect structure 367 (e.g., an $M_q$ layer). In one configuration, each interconnect of the first plurality of interconnects 356 is between a pair of fingers of the third comb interconnect structure 350. In addition, each interconnect of the second plurality of interconnects 386 is between a pair of fingers of the fourth comb interconnect structure 380. In one configuration, each interconnect of the first plurality of interconnects 356 is between a pair of fingers of the first comb interconnect structure 360. In addition, each interconnect of the second plurality of interconnects 386 is between a pair of fingers of the second comb interconnect structure 370. In one configuration, the first plurality of interconnects 356 and the second plurality of interconnects 386 are collinear in the second direction.

In one configuration, as discussed above, the first set of MOS transistors 392 may be pMOS transistors and the second set of MOS transistors 394 may be nMOS transistors. Alternatively, the first set of MOS transistors may be the nMOS transistors 394, and the second set of MOS transistors may be the pMOS transistors 392. In another configuration, both the first set of MOS transistors and the second set of MOS transistors may be pMOS transistors. In yet another configuration, both the first set of MOS transistors and the second set of MOS transistors may be nMOS transistors.

In one configuration, the first transistor source/drain terminal A and the second transistor source/drain terminal A are configured as drains, and the first transistor source/drain terminal B and the second transistor source/drain terminal B are configured as sources. Accordingly, the set of interconnects 302 would be coupled to the drains of the first and second sets of MOS transistors 392, 394, thereby coupling the drains together of the first and second sets of MOS transistors 392, 394, and the sets of interconnects 314, 324 would be coupled to sources of the first and second sets of MOS transistors 392, 394, respectively.

In one configuration, the first transistor source/drain terminal A and the second transistor source/drain terminal A are configured as sources, and the first transistor source/drain terminal B and the second transistor source/drain terminal B are configured as drains. Accordingly, the set of interconnects 302 would be coupled to the sources of the first and second sets of MOS transistors 392, 394, thereby coupling the sources together of the first and second sets of MOS transistors 392, 394, and the sets of interconnects 314, 324 would be coupled to drains of the first and second sets of MOS transistors 392, 394, respectively.

Figure 4:
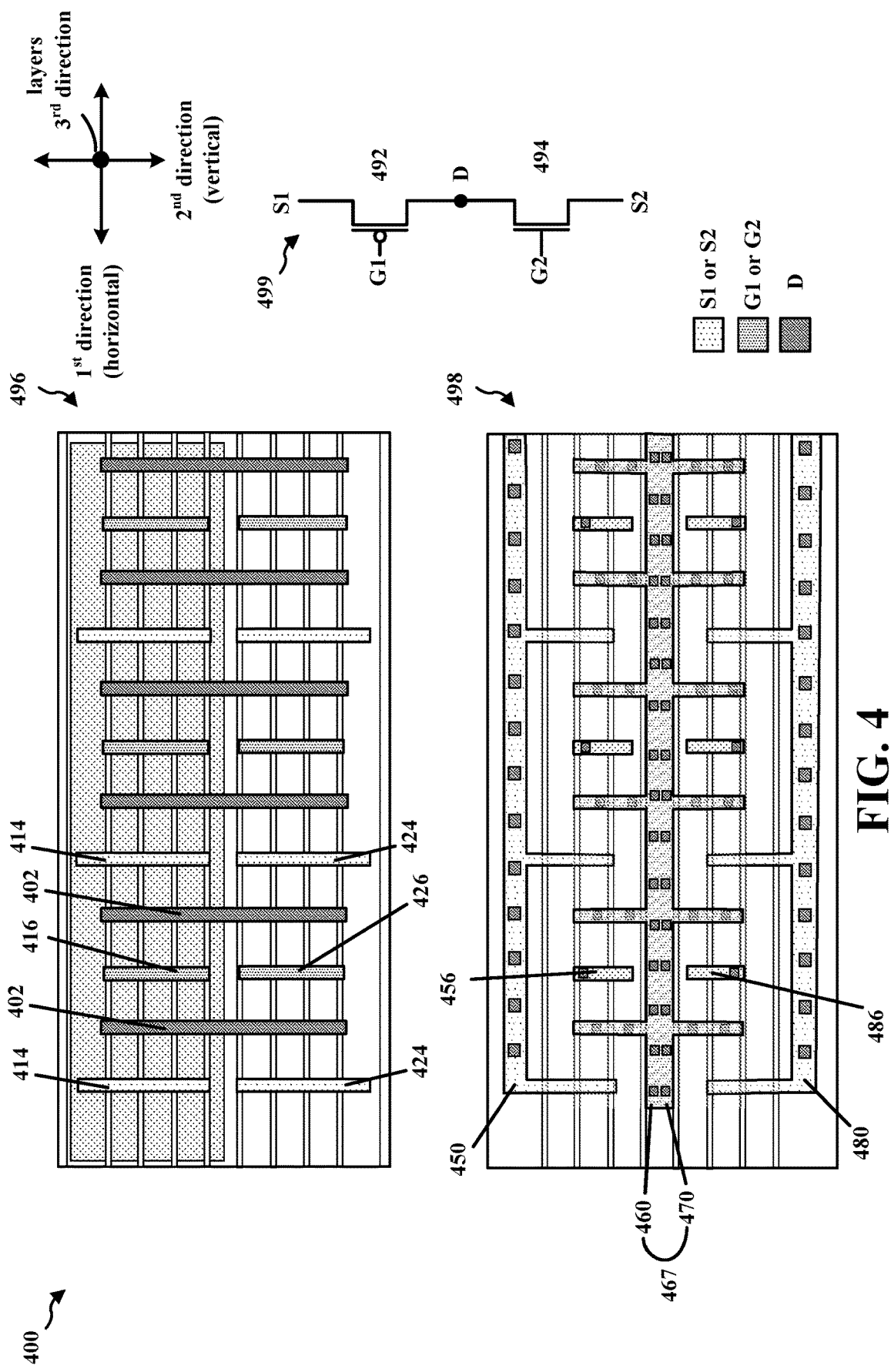
FIG. 4 are diagrams conceptually illustrating a top view of a plurality of interconnect stacks and a top view of comb/fishbone interconnect structures based on a second configuration.

FIG. 4 are diagrams 400 conceptually illustrating a top view 496 of a plurality of interconnect stacks and a top view 498 of comb/fishbone interconnect structures based on a second configuration. Referring to the diagram 496, an IC includes a set of pMOS transistors 492 connected in parallel, and a set of nMOS transistors 494 connected in parallel. As the set of pMOS transistors 492 are connected in parallel, they operate as one pMOS transistor 492, and as the set of nMOS transistors 494 are connected in parallel, they operate as one nMOS transistor 494 (see circuit diagram 499). In circuit diagram 499, a single pMOS transistor symbol 492 is shown to represent the set of pMOS transistors 492 connected in parallel because the set of pMOS transistors 492 are configured to operate as one pMOS transistor 492. Likewise, a single nMOS transistor symbol 494 is shown to represent the set of nMOS transistors 494 connected in parallel because the set of nMOS transistors 494 are configured to operate as one nMOS transistor 494. The drains of the pMOS transistors 492 (i.e., node D) are coupled to the set of interconnect stacks 402. The sources of the pMOS transistors 492 (i.e., node S1) are coupled to the set of interconnect stacks 414. The gates of the pMOS transistors 492 (i.e., node G1) are coupled to the set of interconnect stacks 416. The drains of the nMOS transistors 494 (i.e., node D) are coupled to the set of interconnect stacks 402. The sources of the nMOS transistors 494 (i.e., node S2) are coupled to the set of interconnect stacks 424. The gates of the nMOS transistors 494 (i.e., node G2) are coupled to the set of interconnect stacks 426.

Each of the sets of interconnect stacks 402, 414, 416, 424, 426 may be unidirectional in the second direction (i.e., extend only in the second direction) and may include a plurality of BEOL metal layer interconnects on consecutive BEOL metal layers, coupled together with a plurality of vias into a stack. The number of consecutive BEOL metal layers can vary in different implementations, such as 3, 4, 5, 6, etc. For example, the BEOL metal layer interconnects may be on an $M_1$ layer, an $M_2$ layer, an $M_3$ layer, and an $M_4$ layer. Each of the interconnect stacks 402, 414, 416, 424, 426 provides a lower via resistance connecting each interconnect to interconnects on an adjacent layer than can be provided by a grid-style layout, thereby providing for a reduced via resistance between the $M_4$ and $M_1$ layers compared to a grid-style layout. The interconnect stacks 402, 414, 416, 424, 426 provide a lower via resistance than can be provided by a grid-style layout because more vias are parallelized on the same rectangle of metal layer interconnects than can be provided at the grid junctions (i.e., locations where interconnects on adjacent layers intersect) of a grid-style layout. In addition, spacing of the interconnect stacks 402, 414, 416, 424, 426 may be increased so as to reduce the parasitic capacitance introduced by the adjacent stacks.

The sets of interconnects stacks 402, 414, 416, 424, 426 may generally be on the BEOL metal layers, between layers i and q−1, where the sets of interconnects stacks 402, 414, 416, 424, 426 are unidirectional in layers i to q−1, and where layer q is the first metal layer allowing for interconnects to extend in both the first and second directions. In one example, layer i is layer 1 (i.e., i=1). In other examples, i can be 0, 2, 3, 4, etc. Layer q may vary depending on the fabrication process technology. In one example, layer q is layer 5 (i.e., q=5). In other examples, q can be 4, 6, 7, etc.

Referring to the diagram 498, an IC further includes the comb interconnect structure 450 coupled to the set of interconnect stacks 414 (i.e., node S1), the comb interconnect structure 480 coupled to the set of interconnect stacks 424 (i.e., node S2), the fishbone interconnect structure 467 coupled to the set of interconnect stacks 402 (i.e., node D), the set of interconnects 456 coupled to the set of interconnect stacks 416 (i.e., node G1), and the set of interconnects 486 coupled to the set of interconnect stacks 426 (i.e., node G2). The fishbone interconnect structure 467 is one structure, with comb interconnect substructures 460, 470. In one example, the comb interconnect structures 450, 480, the fishbone interconnect structure 467, the set of interconnects 456, and the set of interconnects 486 are on an $M_5$ layer. The spacing of the combs of the comb interconnect structures 450, 480, the fishbone interconnect structure 467, the set of interconnects 456, and the set of interconnects 486 are aligned with the lower layer interconnect stacks 402, 414, 416, 424, 426, and therefore also reduce the parasitic capacitance introduced by the interconnects.

Referring again to the diagrams 496, 498, an IC may include a first set of MOS transistors 492 or 494. That is, the first set of MOS transistors may be pMOS transistors 492 or nMOS transistors 494. The first set of MOS transistors 492 or 494 may be configured to have a common first transistor source/drain terminal A, a first transistor gate, and a first transistor source/drain terminal B. The IC may further include a first plurality of interconnect stacks 402 coupled to the first transistor source/drain terminal A. Each interconnect stack of the first plurality of interconnect stacks 402 extends in a second direction over at least a portion of the first set of MOS transistors 492 or 494 and includes consecutive metal layer interconnects. The IC may further include a first comb interconnect structure 460 or 470 extending in a first direction orthogonal to the second direction, with comb fingers extending in the second direction over at least a portion of the first set of MOS transistors 492 or 494 and the first plurality of interconnect stacks 402. The first comb interconnect structure 460 or 470 is coupled to the first plurality of interconnect stacks 402. As described previously, the first transistor source/drain terminal A is a drain terminal (i.e., node D), but alternatively, the source/drain connections can be swapped (i.e., with the set of interconnect stacks 402 coupled to a source and the set of interconnect stacks 414 or 424 coupled to a drain), and in such a configuration the first transistor source/drain terminal A would be a source terminal (i.e., node S1 or S2). Note that the illustrated circuit configuration 499 would not apply to the alternate configuration, as the source connections would be coupled together and the drain connections would be uncoupled.

In one configuration, the IC further includes a second plurality of interconnect stacks 414 or 424 extending in the second direction over at least a portion of the first set of MOS transistors. The second plurality of interconnect stacks 414 or 424 is coupled to the first transistor source/drain terminal B. Each interconnect stack of the second plurality of interconnect stacks 414 or 424 includes consecutive metal layer interconnects. As described previously, the first transistor source/drain terminal B is a source terminal (i.e., node S1 or S2), but alternatively, the source/drain connections can be swapped (i.e., with the set of interconnect stacks 402 coupled to a source and the set of interconnect stacks 414 or 424 coupled to a drain), and in such a configuration the first transistor source/drain terminal B would be a drain terminal (i.e., node D). Note that the illustrated circuit configuration 499 would not apply to the alternate configuration, as the source connections would be coupled together and the drain connections would be uncoupled.

As discussed above, the sets of interconnect stacks may be on M1, M2, M3, and M4 layers, and the sets of comb interconnect structures 450, 480, the fishbone interconnect structure 467, the set of interconnects 456, and the set of interconnect 486 may be on an M5 layer. More generally, the sets of interconnect stacks may be on metal i (Mi), metal i+1 (Mi+1), ..., metal q−1 (Mq−1) layers, and the sets of comb interconnect structures 450, 480, the fishbone interconnect structure 467, the set of interconnects 456, and the set of interconnect 486 may be on an Mq layer. Referring to the first plurality of interconnect stacks 402, each interconnect stack of the first plurality of interconnect stacks 402 may include Mp layer interconnects for p=i, i+1, ..., q−1 and corresponding vias Vp for p=i, i+1, ..., q−2 coupling together each interconnect stack of the first plurality of interconnect stacks 402. Referring to the second plurality of interconnect stacks 414 or 424, each interconnect stack of the second plurality of interconnect stacks 414 or 424 may include Mp layer interconnects for p=i, i+1, ..., q−1 and corresponding vias Vp for p=i, i+1, q−2 coupling together each interconnect stack of the second plurality of interconnect stacks 414 or 424. Further, the first comb interconnect structure 460 or 470 may be on the Mq layer. In one example, i=1 and q=5.

In one configuration, a pair of interconnect stacks of the first plurality of interconnect stacks 402 is between each adjacent pair of interconnect stacks of the second plurality of interconnect stacks 414 or 424.

In one configuration, the IC further includes a second comb interconnect structure 450 or 480 extending in the first direction, with comb fingers extending in the second direction over at least a portion of the second plurality of interconnect stacks 414 or 424. The second comb interconnect structure 450 or 480 is coupled to the second plurality of interconnect stacks 414 or 424. The first comb interconnect structure 460 or 470 and the second comb interconnect structure 450 or 480 are on the same metal layer, such as for example, an $M_q$ layer. In one configuration, the first comb interconnect structure 460 or 470 has a density of comb fingers double a density of the comb fingers of the second comb interconnect structure 450 or 480.

In one configuration, the IC may further include a third plurality of interconnect stacks 416 or 426 extending in the second direction over at least a portion of the first set of MOS transistors 492 or 494. The third plurality of interconnect stacks 416 or 426 is coupled to the first transistor gate (i.e., node G1 or G2). Each interconnect stack of the third plurality of interconnect stacks 416 or 426 includes consecutive metal layer interconnects. In one configuration, each interconnect stack of the third plurality of interconnect stacks 416 or 426 may include Mp layer interconnects for p=i, i+1, ..., q−1 and corresponding vias Vp for p=i, i+1, ..., q−2 coupling together each interconnect stack of the third plurality of interconnect stacks. In addition, the first comb interconnect structure 460 or 470 may be on an Mq layer. In one configuration, each interconnect stack of the third plurality of interconnect stacks 416 or 426 is between a corresponding adjacent pair of interconnect stacks of the first plurality of interconnect stacks 402.

In one configuration, the IC may further include a first plurality of interconnects 456 or 486 extending in the second direction over at least a portion of the third plurality of interconnect stacks 416 or 426. The first plurality of interconnects 456 or 486 is coupled to the third plurality of interconnect stacks 416 or 426. The first plurality of interconnects 456 or 486 is on the same metal layer as the first comb interconnect structure 460 or 470 and the second comb interconnect structure 450 or 480 (e.g., on an $M_q$ layer). In one configuration, each interconnect of the first plurality of interconnects 456 or 486 is between an adjacent pair of comb fingers of the first comb interconnect structure 460 or 470.

The first set of MOS transistors may be pMOS transistors 492 or nMOS transistors 494. Herein, so that the description below is not confusing, the first set of MOS transistors are assumed to be the pMOS transistors 492. Accordingly, an IC may include a first set of MOS transistors 492. The first set of MOS transistors 492 may be configured to have a common first transistor source/drain terminal A, a first transistor gate, and a first transistor source/drain terminal B. The IC may further include a first plurality of interconnect stacks 402 coupled to the first transistor source/drain terminal A. Each interconnect stack of the first plurality of interconnect stacks 402 extends in a second direction over at least a portion of the first set of MOS transistors 492 and includes consecutive metal layer interconnects. The IC may further include a first comb interconnect structure 460 extending in a first direction orthogonal to the second direction, with comb fingers extending in the second direction over at least a portion of the first set of MOS transistors 492 and the first plurality of interconnect stacks 402. The first comb interconnect structure 460 is coupled to the first plurality of interconnect stacks 402. As described above, the first transistor source/drain terminal A is a drain terminal (i.e., node D), but alternatively, the source/drain connections can be swapped (i.e., with the set of interconnect stacks 402 coupled to a source and the set of interconnect stacks 414 coupled to a drain), and in such a configuration the first transistor source/drain terminal A would be a source terminal (i.e., node S1). Note that the illustrated circuit configuration 499 would not apply to the alternate configuration, as the source connections would be coupled together and the drain connections would be uncoupled.

In one configuration, the IC may further include a second set of MOS transistors 494. The second set of MOS transistors 494 may be configured to have a common second transistor source/drain terminal B, a second transistor gate, and a second transistor source/drain terminal A. The IC may further include a second comb interconnect structure 470 extending in the first direction, with comb fingers extending in the second direction over at least a portion of the second set of MOS transistors 494 and the first plurality of interconnect stacks 402. The second comb interconnect structure 470 is coupled to the first plurality of interconnect stacks 402. The first comb interconnect structure 460 and the second comb interconnect structure 470 are configured into a fishbone interconnect structure 467. The first plurality of interconnect stacks 402 may be coupled to the second transistor source/drain terminal A, and each interconnect stack of the first plurality of interconnect stacks 402 may extend in the second direction over at least a portion of the second set of MOS transistors 494.

In one configuration, the IC may further include a second plurality of interconnect stacks 414 extending in the second direction over at least a portion of the first set of MOS transistors 492. The second plurality of interconnect stacks 414 is coupled to the first transistor source/drain terminal B. Each interconnect stack of the second plurality of interconnect stacks 414 includes consecutive metal layer interconnects. The IC may further include a third plurality of interconnect stacks 424 extending in the second direction over at least a portion of the second set of MOS transistors 494. The third plurality of interconnect stacks 424 is coupled to the second transistor source/drain terminal B. Each interconnect stack of the third plurality of interconnect stacks 424 includes consecutive metal layer interconnects. In one configuration, each interconnect stack of the first plurality of interconnect stacks 402 includes Mp layer interconnects for p=i, i+1, . . . q−1 and corresponding vias Vp for p=i, i+1, . . . , q−2 coupling together each interconnect stack of the first plurality of interconnect stacks 402. In one configuration, each interconnect stack of the second plurality of interconnect stacks 414 includes Mp layer interconnects for p=i, i+1, . . . q−1 and corresponding vias Vp for p=i, i+1, . . . , q−2 coupling together each interconnect stack of the second plurality of interconnect stacks 414. In addition, each interconnect stack of the third plurality of interconnect stacks 424 includes Mp layer interconnects for p=i, i+1, . . . , q−1 and corresponding vias Vp for p=i, i+1, . . . , q−2 coupling together each interconnect stack of the third plurality of interconnect stacks 424. Further, the fishbone interconnect structure may be on an Mq layer. In one configuration, a pair of interconnect stacks of the first plurality of interconnect stacks 402 is between each adjacent pair of interconnect stacks of the second plurality of interconnect stacks 414, and a pair of interconnect stacks of the first plurality of interconnect stacks 402 is between each adjacent pair of interconnect stacks of the third plurality of interconnect stacks 424. As illustrated in FIG. 4, the second plurality of interconnect stacks 414 and the third plurality of interconnect stacks 424 are collinear in the second direction.

In one configuration, the IC may further include a third comb interconnect structure 450 extending in the first direction orthogonal to the second direction, with comb fingers extending in the second direction over at least a portion of the second plurality of interconnect stacks 414. The third comb interconnect structure 450 is coupled to the second plurality of interconnect stacks 414. The third comb interconnect structure 450 and the fishbone interconnect structure 467 are on the same metal layer (e.g., an $M_q$ layer). In addition, the IC may further include a fourth comb interconnect structure 480 extending in the first direction orthogonal to the second direction, with comb fingers extending in the second direction over at least a portion of the third plurality of interconnect stacks 424. The fourth comb interconnect structure 480 is coupled to the third plurality of interconnect stacks 424. The fourth comb interconnect structure 480 is on the same metal layer as the fishbone interconnect structure 467 (e.g., an $M_q$ layer). In one configuration, the comb fingers of the third comb interconnect structure 450 are collinear in the second direction with the comb fingers of the fourth comb interconnect structure 480. In one configuration, the third comb interconnect structure 450 is configured to be coupled to a first voltage source, and the fourth comb interconnect structure 480 is configured to be coupled to a second voltage source different than the first voltage source. For example, the first voltage source may supply a power supply voltage $V_{dd}$ and the second voltage source may supply a ground voltage $V_{ss}$, where $V_{dd} > V_{ss}$. In one configuration, the first comb interconnect structure 460 has a density of comb fingers double a density of the comb fingers of the third comb interconnect structure 450, and the second comb interconnect structure 470 has a density of comb fingers double a density of the comb fingers of the fourth comb interconnect structure 480.

In one configuration, the IC further includes a fourth plurality of interconnect stacks 416 extending in the second direction over at least a portion of the first set of MOS transistors 492. The fourth plurality of interconnect stacks 416 is coupled to the first transistor gate. Each interconnect stack of the fourth plurality of interconnect stacks 416 includes consecutive metal layer interconnects. In addition, in such a configuration, the IC further includes a fifth plurality of interconnect stacks 426 extending in the second direction over at least a portion of the second set of MOS transistors 494. The fifth plurality of interconnect stacks 426 is coupled to the second transistor gate. Each interconnect stack of the fifth plurality of interconnect stacks 426 includes consecutive metal layer interconnects. In one configuration, each interconnect stack of the fourth plurality of interconnect stacks 416 includes Mp layer interconnects for p=i, i+1, . . . , q−1 and corresponding vias Vp for p=i, i+1, . . . , q−2 coupling together each interconnect stack of the fourth plurality of interconnect stacks 416. In addition, in such a configuration, each interconnect stack of the fifth plurality of interconnect stacks 426 includes Mp layer interconnects for p=i, i+1, q−1 and corresponding vias Vp for p=i, i+1, . . . , q−2 coupling together each interconnect stack of the fifth plurality of interconnect stacks 426. Further, in such a configuration, the fishbone interconnect structure 467 is on an Mq layer. In one configuration, each interconnect stack of the fourth plurality of interconnect stacks 416 is between a corresponding adjacent pair of interconnect stacks of the first plurality of interconnect stacks 402. In addition, each interconnect stack of the fifth plurality of interconnect stacks 426 is between a corresponding adjacent pair of interconnect stacks of the first plurality of interconnect stacks 402. In one configuration, the fourth plurality of interconnect stacks 416 and the fifth plurality of interconnect stacks 426 are collinear in the second direction.

In one configuration, the IC further includes a first plurality of interconnects 456 extending in the second direction over at least a portion of the fourth plurality of interconnect stacks 416. The first plurality of interconnects 456 is coupled to the fourth plurality of interconnect stacks 416. The first plurality of interconnects 456 is on the same metal layer as the fishbone interconnect structure 467 (e.g., an $M_q$ layer). In addition, the IC further includes a second plurality of interconnects 486 extending in the second direction over at least a portion of the fifth plurality of interconnect stacks 426. The second plurality of interconnects 486 is coupled to the fifth plurality of interconnect stacks 426. The second plurality of interconnects 486 is on the same metal layer as the fishbone interconnect structure 467 (e.g., an $M_q$ layer). In one configuration, each interconnect of the first plurality of interconnects 456 is between a pair of fingers of the third comb interconnect structure 450. In addition, each interconnect of the second plurality of interconnects 486 is between a pair of fingers of the fourth comb interconnect structure 480. In one configuration, each interconnect of the first plurality of interconnects 456 is between a pair of fingers of the first comb interconnect structure 460. In addition, each interconnect of the second plurality of interconnects 486 is between a pair of fingers of the second comb interconnect structure 470. In one configuration, the first plurality of interconnects 456 and the second plurality of interconnects 486 are collinear in the second direction.

In one configuration, as discussed above, the first set of MOS transistors 492 may be pMOS transistors and the second set of MOS transistors 494 may be nMOS transistors. Alternatively, the first set of MOS transistors may be the nMOS transistors 494, and the second set of MOS transistors may be the pMOS transistors 492. In another configuration, both the first set of MOS transistors and the second set of MOS transistors may be pMOS transistors. In yet another configuration, both the first set of MOS transistors and the second set of MOS transistors may be nMOS transistors.

In one configuration, the first transistor source/drain terminal A and the second transistor source/drain terminal A are configured as drains, and the first transistor source/drain terminal B and the second transistor source/drain terminal B are configured as sources. Accordingly, the set of interconnects 402 would be coupled to the drains of the first and second sets of MOS transistors 492, 494, thereby coupling the drains together of the first and second sets of MOS transistors 492, 494, and the sets of interconnects 414, 424 would be coupled to sources of the first and second sets of MOS transistors 492, 494, respectively.

In one configuration, the first transistor source/drain terminal A and the second transistor source/drain terminal A are configured as sources, and the first transistor source/drain terminal B and the second transistor source/drain terminal B are configured as drains. Accordingly, the set of interconnects 402 would be coupled to the sources of the first and second sets of MOS transistors 492, 494, thereby coupling the sources together of the first and second sets of MOS transistors 492, 494, and the sets of interconnects 414, 424 would be coupled to drains of the first and second sets of MOS transistors 492, 494, respectively.

Figure 5:
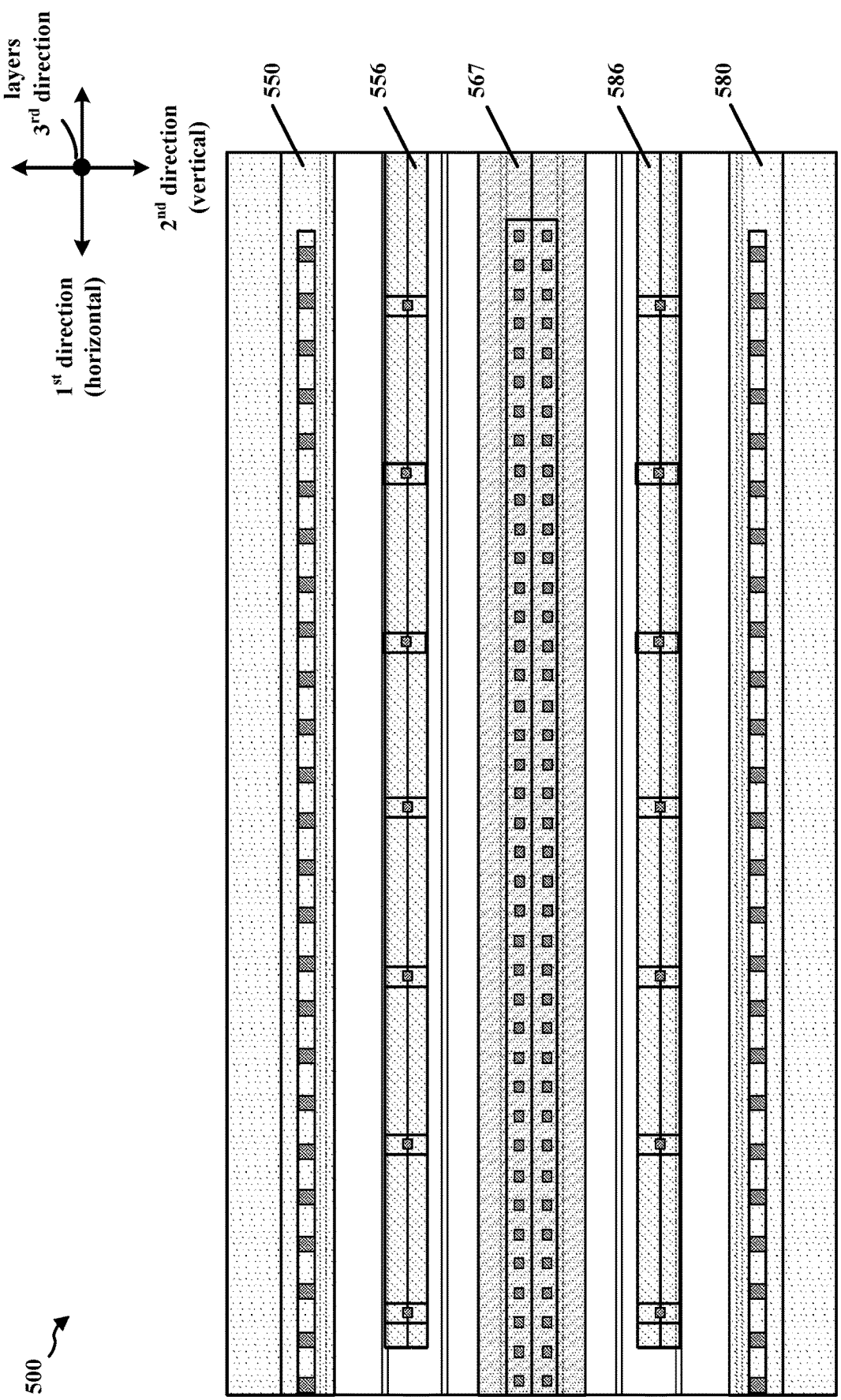
FIG. 5 is a diagram conceptually illustrating a top view of a plurality of interconnects.

FIG. 5 is a diagram 500 conceptually illustrating a top view of a plurality of interconnects. As illustrated in FIG. 5, a plurality of interconnects 550, 556, 567, 586, 580 extend across the IC in the first direction. The interconnect 550, representing node S1, is coupled to the comb interconnect structure 350/450. The interconnect 550 may be configured to be coupled to a first voltage source (e.g., $V_{dd}$), and therefore may couple the comb interconnect structure 350/450 to the first voltage source. The interconnect 556, representing node G1, is coupled to the plurality of interconnects 356/456. The interconnect 567, representing node D, is coupled to the fishbone interconnect structure 367/467. The interconnect 586, representing node G2, is coupled to the plurality of interconnects 386/486. The interconnect 580, representing node S2, is coupled to the comb interconnect structure 380/480. The interconnect 580 may be configured to be coupled to a second voltage source (e.g., $V_{ss}$), and therefore may couple the comb interconnect structure 380/480 to the second voltage source.

Figure 6:
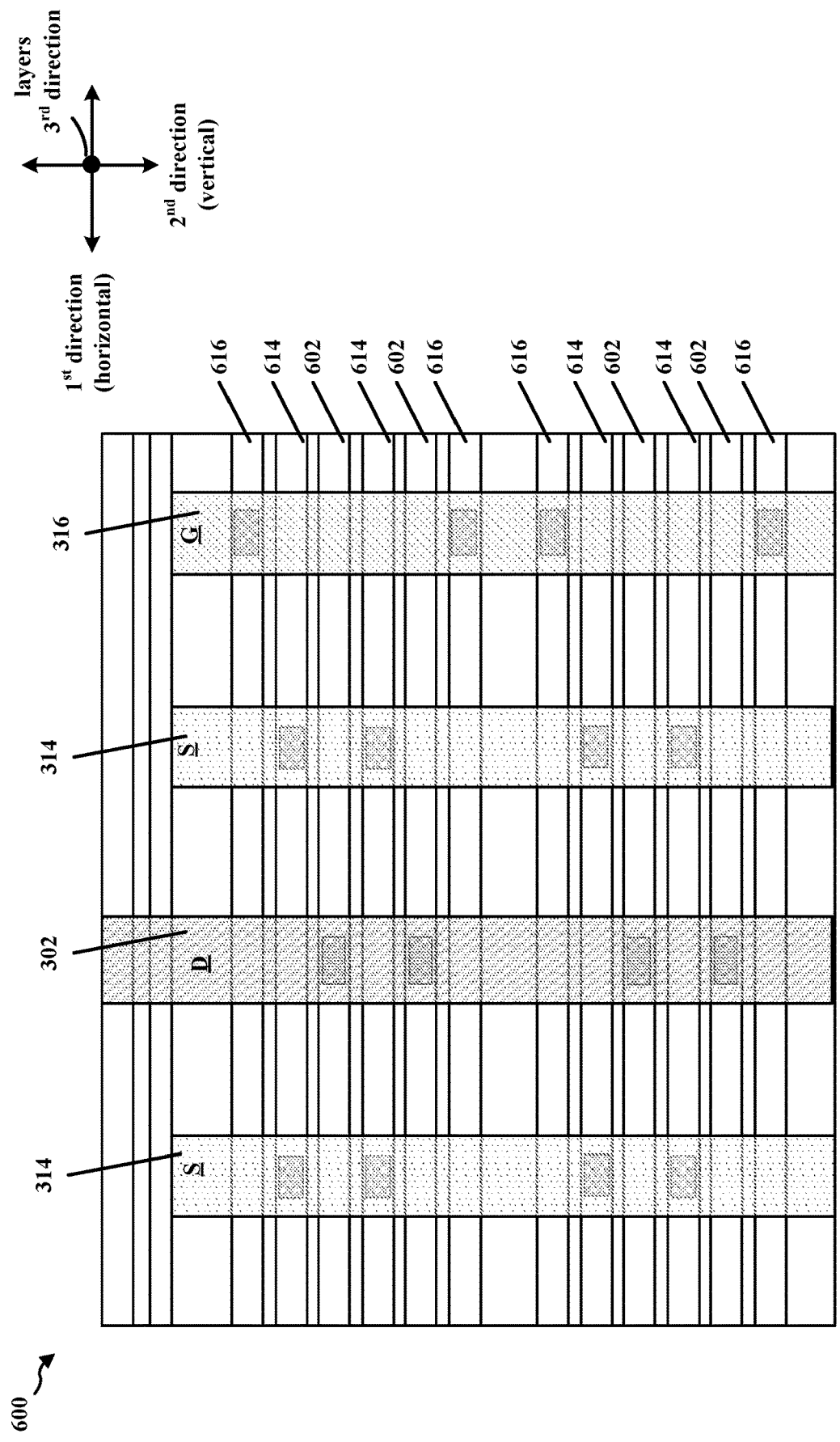
FIG. 6 is a first diagram conceptually illustrating a top view of interconnects that couple a set of transistors to the layout structure of FIGS. 3-5.

FIG. 6 is a first diagram 600 conceptually illustrating a top view of interconnects that couple a set of transistors to the layout structure of FIGS. 3-5. FIG. 6 is a zoomed in portion of FIG. 3, showing just a portion of the layout including the pMOS transistors. Referring to FIG. 6, a plurality of $M_O$ interconnects 616 extending in the first direction are coupled through MP interconnects (see FIG. 7) to the gates of the pMOS transistors 392. The plurality of $M_O$ interconnects 616 are also coupled to the set of interconnect stacks 316. A plurality of $M_O$ interconnects 602 extending in the first direction are coupled through MD interconnects (see FIG. 7) to the drains of the pMOS transistors 392. The plurality of $M_O$ interconnects 602 are also coupled to the set of interconnect stacks 302. A plurality of $M_O$ interconnects 614 extending in the first direction are coupled through MD interconnects (see FIG. 7) to the sources of the pMOS transistors 392. The plurality of $M_O$ interconnects 614 are also coupled to the set of interconnect stacks 314. The plurality of $M_O$ interconnects 602, 614, 616 may be referred to as BEOL interconnects.

Figure 7:
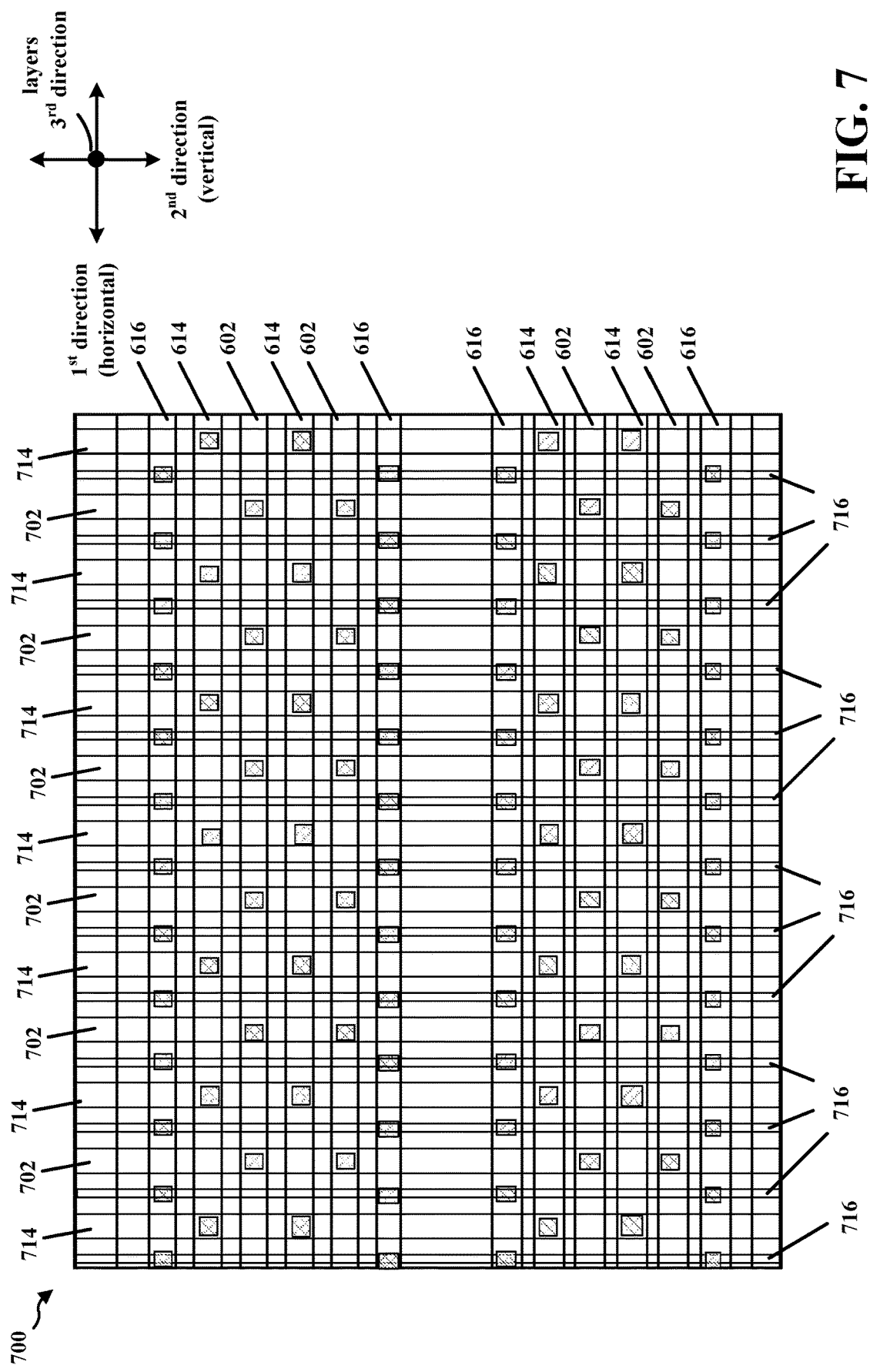
FIG. 7 is a second diagram conceptually illustrating a top view of interconnects that couple a set of transistors to the layout structure of FIGS. 3-5.

FIG. 7 is a second diagram 700 conceptually illustrating a top view of interconnects that couple a set of transistors to the layout structure of FIGS. 3-5. FIG. 7 is a zoomed in portion of FIG. 3, showing just a portion of the layout including the pMOS transistors. Referring to FIG. 7, a plurality of MD interconnects 702 (see 110/210 of FIGS. 1, 2) extending in the second direction are coupled to the drains of the pMOS transistors 392. The plurality of MD interconnects 702 are also coupled to the plurality of $M_O$ interconnects 602, which are coupled to the set of interconnect stacks 302 (see FIG. 6). A plurality of MD interconnects 714 extending in the second direction are coupled to the sources of the pMOS transistors 392. The plurality of MD interconnects 714 (see 110/210 of FIGS. 1, 2) are also coupled to the plurality of $M_O$ interconnects 614, which are coupled to the set of interconnect stacks 314 (see FIG. 6). The gate interconnects 716 are coupled to MP interconnects (see 108/208 of FIGS. 1, 2), which are coupled to the plurality of interconnect stacks 316. (Note that each gate interconnect 716 corresponds to a separate transistor. Each of the pMOS transistors are coupled in parallel and each of the nMOS transistors are coupled in parallel, and therefore as the set of pMOS transistors operate as one pMOS transistor and the set of nMOS transistors operate as one nMOS transistor, they are represented by the single pMOS/nMOS transistor symbols 392, 394 in the circuit diagram 399 of FIG. 3.) The plurality of MD interconnects 702, 714 and the MP interconnects (see 108/208 of FIGS. 1, 2) may be referred to as MEOL interconnects. The MEOL interconnects are on (metal) layers lower than the BEOL interconnects. In other words, the MEOL interconnects are closer to the silicon substrate than the BEOL interconnects.

Referring again to FIGS. 3-7, some vias are illustrated as square and others as rectangular. Note that the illustrated vias, despite their particular illustration, may be (but not limited to) small square, large square, rectangular, or otherwise polygonal (e.g., regular convex polygon). The provided layout includes sets of gate-coupled, drain-coupled, and source-coupled unidirectional metal interconnect stacks between layers i and q−1 that have a lower via resistance than is available through a grid-style layout, and therefore provide for a reduced IR drop than is available through a grid-style layout. Comb and fishbone interconnect structures are provided on a layer q for connecting the lower layer sets of interconnect stacks to the higher metal layers. Layer q allows for bidirectional interconnects. The fishbone metal stacks allow for the creation of low resistance transistor connections for improved IR drop, while keeping parasitic capacitance low through a sufficient metal spacing of the sets of interconnect stacks. The unique configuration with the additional source interconnect stack for shielding the sets of gate-coupled interconnect stacks from the sets of drain-coupled interconnect stacks provides additional improvements in the reduction of the parasitic capacitance, specifically to the parasitic $C_{gd}$ capacitance.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other implementations or teachings described herein, without limitation.

Aspect 1 is an IC including a first set of MOS transistors, the first set of MOS transistors configured to have a common first transistor source/drain terminal A, a first transistor gate, and a first transistor source/drain terminal B; a first plurality of interconnect stacks coupled to the first transistor source/drain terminal A, each interconnect stack of the first plurality of interconnect stacks extending in a second direction over at least a portion of the first set of MOS transistors and including consecutive metal layer interconnects; and a first comb interconnect structure extending in a first direction orthogonal to the second direction, with comb fingers extending in the second direction over at least a portion of the first set of MOS transistors and the first plurality of interconnect stacks, the first comb interconnect structure being coupled to the first plurality of interconnect stacks.

Aspect 2 is the IC of aspect 1, further including a second plurality of interconnect stacks extending in the second direction over at least a portion of the first set of MOS transistors, the second plurality of interconnect stacks being coupled to the first transistor source/drain terminal B, each interconnect stack of the second plurality of interconnect stacks including consecutive metal layer interconnects.

Aspect 3 is the IC of aspect 2, wherein: each interconnect stack of the second plurality of interconnect stacks includes Mp layer interconnects for p=i, i+1, . . . , q−1 and corresponding vias Vp for p=i, i+1, . . . , q−2 coupling together each interconnect stack of the second plurality of interconnect stacks; and the first comb interconnect structure is on a Mq layer.

Aspect 4 is the IC of any of aspects 2 and 3 (see FIG. 3), wherein a pair of interconnect stacks of the second plurality of interconnect stacks is between each adjacent pair of interconnect stacks of the first plurality of interconnect stacks.

Aspect 5 is the IC of any of aspects 2 and 3 (see FIG. 4), wherein a pair of interconnect stacks of the first plurality of interconnect stacks is between each adjacent pair of interconnect stacks of the second plurality of interconnect stacks.

Aspect 6 is the IC of any of aspects 2 to 5, further including a second comb interconnect structure extending in the first direction, with comb fingers extending in the second direction over at least a portion of the second plurality of interconnect stacks, the second comb interconnect structure being coupled to the second plurality of interconnect stacks, the first comb interconnect structure and the second comb interconnect structure being on a same metal layer.

Aspect 7 is the IC of aspect 6 (see FIG. 3), wherein the second comb interconnect structure has a density of the comb fingers double a density of the comb fingers of the first comb interconnect structure.

Aspect 8 is the IC of aspect 6 (see FIG. 4), wherein the first comb interconnect structure has a density of the comb fingers double a density of the comb fingers of the second comb interconnect structure.

Aspect 9 is the IC of any of aspects 6 to 8, further including a third plurality of interconnect stacks extending in the second direction over at least a portion of the first set of MOS transistors, the third plurality of interconnect stacks being coupled to the first transistor gate, each interconnect stack of the third plurality of interconnect stacks including consecutive metal layer interconnects.

Aspect 10 is the IC of aspect 9, wherein: each interconnect stack of the third plurality of interconnect stacks includes Mp layer interconnects for p=i, i+1, . . . , q−1 and corresponding vias Vp for p=i, i+1, . . . , q−2 coupling together each interconnect stack of the third plurality of interconnect stacks; and the first comb interconnect structure is on a Mq layer.

Aspect 11 is the IC of any of aspects 9 and 10 (see FIG. 3), wherein each interconnect stack of the third plurality of interconnect stacks is between a corresponding adjacent pair of interconnect stacks of the second plurality of interconnect stacks.

Aspect 12 is the IC of any of aspects 9 and 10 (see FIG. 4), wherein each interconnect stack of the third plurality of interconnect stacks is between a corresponding adjacent pair of interconnect stacks of the first plurality of interconnect stacks.

Aspect 13 is the IC of any of aspects 9 to 12, further including a first plurality of interconnects extending in the second direction over at least a portion of the third plurality of interconnect stacks, the first plurality of interconnects being coupled to the third plurality of interconnect stacks, the first plurality of interconnects being on a same metal layer as the first comb interconnect structure and the second comb interconnect structure.

Aspect 14 is the IC of aspect 13 (see FIG. 3), wherein each interconnect of the first plurality of interconnects is between an adjacent pair of the comb fingers of the second comb interconnect structure.

Aspect 15 is the IC of aspect 13 (see FIG. 4), wherein each interconnect of the first plurality of interconnects is between an adjacent pair of the comb fingers of the first comb interconnect structure.

Aspect 16 is the IC of aspect 1, further including a second set of MOS transistors, the second set of MOS transistors configured to have a common second transistor source/drain terminal B, a second transistor gate, and a second transistor source/drain terminal A; and a second comb interconnect structure extending in the first direction, with comb fingers extending in the second direction over at least a portion of the second set of MOS transistors and the first plurality of interconnect stacks, the second comb interconnect structure being coupled to the first plurality of interconnect stacks, the first comb interconnect structure and the second comb interconnect structure being configured into a fishbone interconnect structure; wherein the first plurality of interconnect stacks is coupled to the second transistor source/drain terminal A, and each interconnect stack of the first plurality of interconnect stacks extends in the second direction over at least a portion of the second set of MOS transistors.

Aspect 17 is the IC of aspect 16, further including a second plurality of interconnect stacks extending in the second direction over at least a portion of the first set of MOS transistors, the second plurality of interconnect stacks being coupled to the first transistor source/drain terminal B, each interconnect stack of the second plurality of interconnect stacks including consecutive metal layer interconnects; and a third plurality of interconnect stacks extending in the second direction over at least a portion of the second set of MOS transistors, the third plurality of interconnect stacks being coupled to the second transistor source/drain terminal B, each interconnect stack of the third plurality of interconnect stacks including consecutive metal layer interconnects.

Aspect 18 is the IC of aspect 17, wherein: each interconnect stack of the second plurality of interconnect stacks includes Mp layer interconnects for p=i, i+1, . . . , q−1 and corresponding vias Vp for p=i, i+1, . . . , q−2 coupling together each interconnect stack of the second plurality of interconnect stacks; each interconnect stack of the third plurality of interconnect stacks includes Mp layer interconnects for p=i, i+1, . . . , q−1 and corresponding vias Vp for p=i, i+1, . . . q−2 coupling together each interconnect stack of the third plurality of interconnect stacks; and the fishbone interconnect structure is on a Mq layer.

Aspect 19 is the IC of any of aspects 17 and 18 (see FIG. 3), wherein: a pair of interconnect stacks of the second plurality of interconnect stacks is between each adjacent pair of interconnect stacks of the first plurality of interconnect stacks; and a pair of interconnect stacks of the third plurality of interconnect stacks is between each adjacent pair of interconnect stacks of the first plurality of interconnect stacks.

Aspect 20 is the IC of any of aspects 17 and 18 (see FIG. 4), wherein: a pair of interconnect stacks of the first plurality of interconnect stacks is between each adjacent pair of interconnect stacks of the second plurality of interconnect stacks; and a pair of interconnect stacks of the first plurality of interconnect stacks is between each adjacent pair of interconnect stacks of the third plurality of interconnect stacks.

Aspect 21 is the IC of any of aspects 17 to 20, wherein the second plurality of interconnect stacks and the third plurality of interconnect stacks are collinear in the second direction.

Aspect 22 is the IC of any of aspects 17 to 21, further including: a third comb interconnect structure extending in the first direction orthogonal to the second direction, with comb fingers extending in the second direction over at least a portion of the second plurality of interconnect stacks, the third comb interconnect structure being coupled to the second plurality of interconnect stacks, the third comb interconnect structure and the fishbone interconnect structure being on a same metal layer; and a fourth comb interconnect structure extending in the first direction orthogonal to the second direction, with comb fingers extending in the second direction over at least a portion of the third plurality of interconnect stacks, the fourth comb interconnect structure being coupled to the third plurality of interconnect stacks, the fourth comb interconnect structure being on a same metal layer as the fishbone interconnect structure.

Aspect 23 is the IC of aspect 22, wherein the comb fingers of the third comb interconnect structure are collinear in the second direction with the comb fingers of the fourth comb interconnect structure.

Aspect 24 is the IC of aspect 22, wherein the third comb interconnect structure is configured to be coupled to a first voltage source, and the fourth comb interconnect structure is configured to be coupled to a second voltage source different than the first voltage source.

Aspect 25 is the IC of any of aspects 22 to 24 (see FIG. 3), wherein: the third comb interconnect structure has a density of the comb fingers double a density of the comb fingers of the first comb interconnect structure; and the fourth comb interconnect structure has a density of the comb fingers double a density of the comb fingers of the second comb interconnect structure.

Aspect 26 is the IC of any of aspects 22 to 24 (see FIG. 4), wherein: the first comb interconnect structure has a density of the comb fingers double a density of the comb fingers of the third comb interconnect structure; and the second comb interconnect structure has a density of the comb fingers double a density of the comb fingers of the fourth comb interconnect structure.

Aspect 27 is the IC of any of aspects 22 to 26, further including: a fourth plurality of interconnect stacks extending in the second direction over at least a portion of the first set of MOS transistors, the fourth plurality of interconnect stacks being coupled to the first transistor gate, each interconnect stack of the fourth plurality of interconnect stacks including consecutive metal layer interconnects; and a fifth plurality of interconnect stacks extending in the second direction over at least a portion of the second set of MOS transistors, the fifth plurality of interconnect stacks being coupled to the second transistor gate, each interconnect stack of the fifth plurality of interconnect stacks including consecutive metal layer interconnects.

Aspect 28 is the IC of aspect 27, wherein: each interconnect stack of the fourth plurality of interconnect stacks includes Mp layer interconnects for p=i, i+1, . . . , q−1 and corresponding vias Vp for p=i, i+1, . . . , q−2 coupling together each interconnect stack of the fourth plurality of interconnect stacks; each interconnect stack of the fifth plurality of interconnect stacks includes Mp layer interconnects for p=i, i+1, . . . , q−1 and corresponding vias Vp for p=i, i+1, . . . q−2 coupling together each interconnect stack of the fifth plurality of interconnect stacks; and the fishbone interconnect structure is on a Mq layer.

Aspect 29 is the IC of any of aspects 27 and 28 (see FIG. 3), wherein: each interconnect stack of the fourth plurality of interconnect stacks is between a corresponding adjacent pair of interconnect stacks of the second plurality of interconnect stacks; and each interconnect stack of the fifth plurality of interconnect stacks is between a corresponding adjacent pair of interconnect stacks of the third plurality of interconnect stacks.

Aspect 30 is the IC of any of aspects 27 to 28 (see FIG. 4), wherein: each interconnect stack of the fourth plurality of interconnect stacks is between a corresponding adjacent pair of interconnect stacks of the first plurality of interconnect stacks; and each interconnect stack of the fifth plurality of interconnect stacks is between a corresponding adjacent pair of interconnect stacks of the first plurality of interconnect stacks.

Aspect 31 is the IC of any of aspects 27 to 30, wherein the fourth plurality of interconnect stacks and the fifth plurality of interconnect stacks are collinear in the second direction.

Aspect 32 is the IC of any of aspects 27 to 31, further including: a first plurality of interconnects extending in the second direction over at least a portion of the fourth plurality of interconnect stacks, the first plurality of interconnects being coupled to the fourth plurality of interconnect stacks, the first plurality of interconnects being on a same metal layer as the fishbone interconnect structure; and a second plurality of interconnects extending in the second direction over at least a portion of the fifth plurality of interconnect stacks, the second plurality of interconnects being coupled to the fifth plurality of interconnect stacks, the second plurality of interconnects being on a same metal layer as the fishbone interconnect structure.

Aspect 33 is the IC of aspect 32, wherein: each interconnect of the first plurality of interconnects is between a pair of fingers of the third comb interconnect structure; and each interconnect of the second plurality of interconnects is between a pair of fingers of the fourth comb interconnect structure.

Aspect 34 is the IC of any of aspects 32 and 33, wherein: each interconnect of the first plurality of interconnects is between a pair of fingers of the first comb interconnect structure; and each interconnect of the second plurality of interconnects is between a pair of fingers of the second comb interconnect structure.

Aspect 35 is the IC of any of aspects 32 to 34, wherein the first plurality of interconnects and the second plurality of interconnects are collinear in the second direction.

Aspect 36 is the IC of any of aspects 16 to 35, wherein the first set of MOS transistors comprises pMOS transistors and the second set of MOS transistors comprises nMOS transistors, or the first set of MOS transistors comprises nMOS transistors and the second set of MOS transistors comprises pMOS transistors.

Aspect 37 is the IC of any of aspects 16 to 35, wherein the first set of MOS transistors comprises pMOS transistors and the second set of MOS transistors comprises pMOS transistors.

Aspect 38 is the IC of any of aspects 16 to 35, wherein the first set of MOS transistors comprises nMOS transistors and the second set of MOS transistors comprises nMOS transistors.

Aspect 39 is the IC of any of aspects 16 to 38, wherein the first transistor source/drain terminal A and the second transistor source/drain terminal A are configured as drains, and the first transistor source/drain terminal B and the second transistor source/drain terminal B are configured as sources.

Aspect 40 is the IC of any of aspects 16 to 38, wherein the first transistor source/drain terminal A and the second transistor source/drain terminal A are configured as sources, and the first transistor source/drain terminal B and the second transistor source/drain terminal B are configured as drains.

Aspect 41 is the IC of any of aspects 1 to 40, wherein the first set of MOS transistors comprises pMOS transistors or nMOS transistors.

Aspect 42 is the IC of any of aspects 1 to 41, wherein the consecutive metal layer interconnects in each interconnect stack of the first plurality of interconnect stacks are unidirectional in the second direction.

Aspect 43 is the IC of any of aspects 1 to 42, wherein: each interconnect stack of the first plurality of interconnect stacks includes Mp layer interconnects for p=i, i+1, ..., q-1 and corresponding vias Vp for p=i, i+1, ..., q-2 coupling together each interconnect stack of the first plurality of interconnect stacks; and the first comb interconnect structure is on an Mq layer.

Aspect 44 is the IC of aspect 43, wherein i=1 and q=5.

Aspect 45 is the IC of any of aspects 1 to 44, further including a set of MEOL interconnects coupled to the first transistor source/drain terminal A, the set of MEOL interconnects being on one or more layers lower than the first plurality of interconnect stacks; and a set of BEOL interconnects coupled to the set of MEOL interconnects, the set of BEOL interconnects being on one or more layers lower than the first plurality of interconnect stacks, the first plurality of interconnect stacks being coupled to the set of BEOL interconnects Aspect 46 is the IC of any of aspects 1 to 39 and 41 to 45, wherein the first transistor source/drain terminal A is configured as a drain, and the first transistor source/drain terminal B is configured as a source.

Aspect 47 is the IC of any of aspects 1 to 38 and 40 to 45, wherein the first transistor source/drain terminal A is configured as a source, and the first transistor source/drain terminal B is configured as a drain.

What is claimed is:

1. An integrated circuit (IC), comprising:
a first set of metal oxide semiconductor (MOS) transistors, the first set of MOS transistors configured to have a common first transistor source/drain terminal A, a first transistor gate, and a first transistor source/drain terminal B;
a first plurality of interconnect stacks coupled to the first transistor source/drain terminal A, each interconnect stack of the first plurality of interconnect stacks extending in a second direction over at least a portion of the first set of MOS transistors and including consecutive metal layer interconnects; and
a first comb interconnect structure extending in a first direction orthogonal to the second direction, with comb fingers extending in the second direction over at least a portion of the first set of MOS transistors and the first plurality of interconnect stacks, the first comb interconnect structure being coupled to the first plurality of interconnect stacks, wherein
each interconnect stack of the first plurality of interconnect stacks includes metal p ($M_p$) layer interconnects for p=i, i+1, ..., q-1 and corresponding vias $V_p$ for p=i, i+1, ..., q-2 coupling together each interconnect stack of the first plurality of interconnect stacks, wherein i=1 and q>=4, and the first comb interconnect structure is on a metal q ($M_q$) layer.

2. The IC of claim 1, further comprising a second plurality of interconnect stacks extending in the second direction over at least a portion of the first set of MOS transistors, the second plurality of interconnect stacks being coupled to the first transistor source/drain terminal B, each interconnect stack of the second plurality of interconnect stacks including consecutive metal layer interconnects.

3. The IC of claim 2, wherein:
each interconnect stack of the second plurality of interconnect stacks includes metal p ($M_p$) layer interconnects for p=i, i+1, ..., q-1 and corresponding vias $V_p$ for p=i, i+1, ..., q-2 coupling together each interconnect stack of the second plurality of interconnect stacks.

4. The IC of claim 2, wherein a pair of interconnect stacks of the second plurality of interconnect stacks is between each adjacent pair of interconnect stacks of the first plurality of interconnect stacks.

5. The IC of claim 2, wherein a pair of interconnect stacks of the first plurality of interconnect stacks is between each adjacent pair of interconnect stacks of the second plurality of interconnect stacks.

6. The IC of claim 2, further comprising a second comb interconnect structure extending in the first direction, with comb fingers extending in the second direction over at least a portion of the second plurality of interconnect stacks, the second comb interconnect structure being coupled to the second plurality of interconnect stacks, the first comb interconnect structure and the second comb interconnect structure being on a same metal layer.

7. The IC of claim 6, wherein the second comb interconnect structure has a density of the comb fingers double a density of the comb fingers of the first comb interconnect structure.

8. The IC of claim 6, wherein the first comb interconnect structure has a density of the comb fingers double a density of the comb fingers of the second comb interconnect structure.

9. The IC of claim 6, further comprising a third plurality of interconnect stacks extending in the second direction over at least a portion of the first set of MOS transistors, the third plurality of interconnect stacks being coupled to the first transistor gate, each interconnect stack of the third plurality of interconnect stacks including consecutive metal layer interconnects.

10. The IC of claim 9, wherein:
each interconnect stack of the third plurality of interconnect stacks includes metal p ($M_p$) layer interconnects for p=i, i+1, ..., q−1 and corresponding vias $V_p$ for p=i, i+1, ..., q−2 coupling together each interconnect stack of the third plurality of interconnect stacks.

11. The IC of claim 9, wherein each interconnect stack of the third plurality of interconnect stacks is between a corresponding adjacent pair of interconnect stacks of the second plurality of interconnect stacks.

12. The IC of claim 9, wherein each interconnect stack of the third plurality of interconnect stacks is between a corresponding adjacent pair of interconnect stacks of the first plurality of interconnect stacks.

13. The IC of claim 9, further comprising a first plurality of interconnects extending in the second direction over at least a portion of the third plurality of interconnect stacks, the first plurality of interconnects being coupled to the third plurality of interconnect stacks, the first plurality of interconnects being on a same metal layer as the first comb interconnect structure and the second comb interconnect structure.

14. The IC of claim 13, wherein each interconnect of the first plurality of interconnects is between an adjacent pair of the comb fingers of the second comb interconnect structure.

15. The IC of claim 13, wherein each interconnect of the first plurality of interconnects is between an adjacent pair of the comb fingers of the first comb interconnect structure.

16. The IC of claim 1, further comprising:
a second set of MOS transistors, the second set of MOS transistors configured to have a common second transistor source/drain terminal B, a second transistor gate, and a second transistor source/drain terminal A; and
a second comb interconnect structure extending in the first direction, with comb fingers extending in the second direction over at least a portion of the second set of MOS transistors and the first plurality of interconnect stacks, the second comb interconnect structure being coupled to the first plurality of interconnect stacks, the first comb interconnect structure and the second comb interconnect structure being configured into a fishbone interconnect structure;
wherein the first plurality of interconnect stacks is coupled to the second transistor source/drain terminal A, and each interconnect stack of the first plurality of interconnect stacks extends in the second direction over at least a portion of the second set of MOS transistors.

17. The IC of claim 16, further comprising:
a second plurality of interconnect stacks extending in the second direction over at least a portion of the first set of MOS transistors, the second plurality of interconnect stacks being coupled to the first transistor source/drain terminal B, each interconnect stack of the second plurality of interconnect stacks including consecutive metal layer interconnects; and
a third plurality of interconnect stacks extending in the second direction over at least a portion of the second set of MOS transistors, the third plurality of interconnect stacks being coupled to the second transistor source/drain terminal B, each interconnect stack of the third plurality of interconnect stacks including consecutive metal layer interconnects.

18. The IC of claim 17, wherein:
each interconnect stack of the second plurality of interconnect stacks includes metal p ($M_p$) layer interconnects for p=i, i+1, ..., q−1 and corresponding vias $V_p$ for p=i, i+1, ..., q−2 coupling together each interconnect stack of the second plurality of interconnect stacks;
each interconnect stack of the third plurality of interconnect stacks includes $M_p$ layer interconnects for p=i, i+1, ..., q−1 and corresponding vias $V_p$ for p=i, i+1, ..., q−2 coupling together each interconnect stack of the third plurality of interconnect stacks; and
the fishbone interconnect structure is on a metal q ($M_q$) layer.

19. The IC of claim 17, wherein:
a pair of interconnect stacks of the second plurality of interconnect stacks is between each adjacent pair of interconnect stacks of the first plurality of interconnect stacks; and
a pair of interconnect stacks of the third plurality of interconnect stacks is between each adjacent pair of interconnect stacks of the first plurality of interconnect stacks.

20. The IC of claim 17, wherein:
a pair of interconnect stacks of the first plurality of interconnect stacks is between each adjacent pair of interconnect stacks of the second plurality of interconnect stacks; and
a pair of interconnect stacks of the first plurality of interconnect stacks is between each adjacent pair of interconnect stacks of the third plurality of interconnect stacks.

21. The IC of claim 17, wherein the second plurality of interconnect stacks and the third plurality of interconnect stacks are collinear in the second direction.

22. The IC of claim 17, further comprising:
a third comb interconnect structure extending in the first direction orthogonal to the second direction, with comb fingers extending in the second direction over at least a portion of the second plurality of interconnect stacks, the third comb interconnect structure being coupled to the second plurality of interconnect stacks, the third comb interconnect structure and the fishbone interconnect structure being on a same metal layer; and a fourth comb interconnect structure extending in the first direction orthogonal to the second direction, with comb fingers extending in the second direction over at least a portion of the third plurality of interconnect stacks, the fourth comb interconnect structure being coupled to the third plurality of interconnect stacks, the fourth comb interconnect structure being on a same metal layer as the fishbone interconnect structure.

23. The IC of claim 22, wherein the comb fingers of the third comb interconnect structure are collinear in the second direction with the comb fingers of the fourth comb interconnect structure.

24. The IC of claim 22, wherein the third comb interconnect structure is configured to be coupled to a first voltage source, and the fourth comb interconnect structure is configured to be coupled to a second voltage source different than the first voltage source.

25. The IC of claim 22, wherein:
the third comb interconnect structure has a density of the comb fingers double a density of the comb fingers of the first comb interconnect structure; and
the fourth comb interconnect structure has a density of the comb fingers double a density of the comb fingers of the second comb interconnect structure.

26. The IC of claim 22, wherein:
the first comb interconnect structure has a density of the comb fingers double a density of the comb fingers of the third comb interconnect structure; and
the second comb interconnect structure has a density of the comb fingers double a density of the comb fingers of the fourth comb interconnect structure.

27. The IC of claim 22, further comprising:
a fourth plurality of interconnect stacks extending in the second direction over at least a portion of the first set of MOS transistors, the fourth plurality of interconnect stacks being coupled to the first transistor gate, each interconnect stack of the fourth plurality of interconnect stacks including consecutive metal layer interconnects; and
a fifth plurality of interconnect stacks extending in the second direction over at least a portion of the second set of MOS transistors, the fifth plurality of interconnect stacks being coupled to the second transistor gate, each interconnect stack of the fifth plurality of interconnect stacks including consecutive metal layer interconnects.

28. The IC of claim 27, wherein:
each interconnect stack of the fourth plurality of interconnect stacks includes metal p ($M_p$) layer interconnects for p=i, i+1, . . . , q−1 and corresponding vias $V_p$ for p=i, i+1, . . . , q−2 coupling together each interconnect stack of the fourth plurality of interconnect stacks;
each interconnect stack of the fifth plurality of interconnect stacks includes metal p ($M_p$) layer interconnects for p=i, i+1, . . . , q−1 and corresponding vias $V_p$ for p=i, i+1, . . . , q−2 coupling together each interconnect stack of the fifth plurality of interconnect stacks; and
the fishbone interconnect structure is on a metal q ($M_q$) layer.

29. The IC of claim 27, wherein:
each interconnect stack of the fourth plurality of interconnect stacks is between a corresponding adjacent pair of interconnect stacks of the second plurality of interconnect stacks; and each interconnect stack of the fifth plurality of interconnect stacks is between a corresponding adjacent pair of interconnect stacks of the third plurality of interconnect stacks.

30. The IC of claim 27, wherein:
each interconnect stack of the fourth plurality of interconnect stacks is between a corresponding adjacent pair of interconnect stacks of the first plurality of interconnect stacks; and
each interconnect stack of the fifth plurality of interconnect stacks is between a corresponding adjacent pair of interconnect stacks of the first plurality of interconnect stacks.

31. The IC of claim 27, wherein the fourth plurality of interconnect stacks and the fifth plurality of interconnect stacks are collinear in the second direction.

32. The IC of claim 27, further comprising:
a first plurality of interconnects extending in the second direction over at least a portion of the fourth plurality of interconnect stacks, the first plurality of interconnects being coupled to the fourth plurality of interconnect stacks, the first plurality of interconnects being on a same metal layer as the fishbone interconnect structure; and
a second plurality of interconnects extending in the second direction over at least a portion of the fifth plurality of interconnect stacks, the second plurality of interconnects being coupled to the fifth plurality of interconnect stacks, the second plurality of interconnects being on a same metal layer as the fishbone interconnect structure.

33. The IC of claim 32, wherein:
each interconnect of the first plurality of interconnects is between a pair of fingers of the third comb interconnect structure; and
each interconnect of the second plurality of interconnects is between a pair of fingers of the fourth comb interconnect structure.

34. The IC of claim 32, wherein:
each interconnect of the first plurality of interconnects is between a pair of fingers of the first comb interconnect structure; and
each interconnect of the second plurality of interconnects is between a pair of fingers of the second comb interconnect structure.

35. The IC of claim 32, wherein the first plurality of interconnects and the second plurality of interconnects are collinear in the second direction.

36. The IC of claim 16, wherein the first set of MOS transistors comprises p-type MOS (pMOS) transistors and the second set of MOS transistors comprises n-type MOS (nMOS) transistors, or the first set of MOS transistors comprises nMOS transistors and the second set of MOS transistors comprises pMOS transistors.

37. The IC of claim 16, wherein the first set of MOS transistors comprises p-type MOS (pMOS) transistors and the second set of MOS transistors comprises pMOS transistors.

38. The IC of claim 16, wherein the first set of MOS transistors comprises n-type MOS (nMOS) transistors and the second set of MOS transistors comprises nMOS transistors.

39. The IC of claim 16, wherein the first transistor source/drain terminal A and the second transistor source/drain terminal A are configured as drains, and the first transistor source/drain terminal B and the second transistor source/drain terminal B are configured as sources.

40. The IC of claim 16, wherein the first transistor source/drain terminal A and the second transistor source/drain terminal A are configured as sources, and the first transistor source/drain terminal B and the second transistor source/drain terminal B are configured as drains.

41. The IC of claim 1, wherein the first set of MOS transistors comprises p-type MOS (pMOS) transistors or n-type MOS (nMOS) transistors.

42. The IC of claim 1, wherein the consecutive metal layer interconnects in each interconnect stack of the first plurality of interconnect stacks are unidirectional in the second direction.

43. The IC of claim 1, wherein q=5.

44. The IC of claim 1, further comprising:
- a set of middle-end-of-line (MEOL) interconnects coupled to the first transistor source/drain terminal A, the set of MEOL interconnects being on one or more layers lower than the first plurality of interconnect stacks; and
- a set of back-end-of-line (BEOL) interconnects coupled to the set of MEOL interconnects, the set of BEOL interconnects being on one or more layers lower than the first plurality of interconnect stacks, the first plurality of interconnect stacks being coupled to the set of BEOL interconnects.

45. The IC of claim 1, wherein the first transistor source/drain terminal A is configured as a drain, and the first transistor source/drain terminal B is configured as a source.

46. The IC of claim 1, wherein the first transistor source/drain terminal A is configured as a source, and the first transistor source/drain terminal B is configured as a drain.

* * * * *